(12) United States Patent
Osawa et al.

(10) Patent No.: US 10,355,194 B2
(45) Date of Patent: Jul. 16, 2019

(54) PIEZOELECTRIC DEVICE AND METHOD OF DRIVING PIEZOELECTRIC DEVICE

(71) Applicant: Seiko Epson Corporation, Tokyo (JP)

(72) Inventors: Eiji Osawa, Suwa (JP); Yoshihiro Hokari, Azumino (JP); Akira Kuriki, Shiojiri (JP)

(73) Assignee: Seiko Epson Corporation (JP)

( * ) Notice: Subject to any disclaimer, the term of this patent is extended or adjusted under 35 U.S.C. 154(b) by 266 days.

(21) Appl. No.: 15/251,258

(22) Filed: Aug. 30, 2016

(65) Prior Publication Data

US 2017/0098753 A1    Apr. 6, 2017

(30) Foreign Application Priority Data

Oct. 5, 2015 (JP) ................. 2015-197951

(51) Int. Cl.

| | |
|---|---|
| *H01L 41/047* | (2006.01) |
| *H01L 41/09* | (2006.01) |
| *H01L 41/04* | (2006.01) |
| *B41J 2/045* | (2006.01) |
| *H01L 41/08* | (2006.01) |
| *H01L 41/187* | (2006.01) |
| *H01L 41/318* | (2013.01) |

(52) U.S. Cl.
CPC .......... *H01L 41/042* (2013.01); *B41J 2/0459* (2013.01); *B41J 2/04581* (2013.01); *B41J 2/04588* (2013.01); *H01L 41/0815* (2013.01); *H01L 41/0973* (2013.01); *H01L 41/1876* (2013.01); *H01L 41/318* (2013.01)

(58) Field of Classification Search
CPC ... H01L 41/042; H01L 41/02; H01L 41/0815; H01L 41/0973; H01L 41/1876; H01L 41/318; B41J 2/04581; B41J 2/0459
USPC ........................................ 310/317
See application file for complete search history.

(56) References Cited

U.S. PATENT DOCUMENTS

| | | | | |
|---|---|---|---|---|
| 4,376,255 A | * | 3/1983 | Kleinschmidt | G01S 7/524 310/316.01 |
| 4,525,728 A | * | 6/1985 | Koto | B41J 2/14233 347/40 |
| 5,942,835 A | * | 8/1999 | Furuhashi | H01L 41/044 310/316.01 |
| 8,662,644 B2 | | 3/2014 | Nawano et al. | |
| 9,022,533 B2 | | 5/2015 | Yazaki et al. | |

(Continued)

FOREIGN PATENT DOCUMENTS

| | | | | |
|---|---|---|---|---|
| JP | 09141867 A | * | 6/1997 | ............. B41J 2/045 |
| JP | 2008-159735 A | | 7/2008 | |

(Continued)

*Primary Examiner* — Thomas M Dougherty
(74) *Attorney, Agent, or Firm* — Harness, Dickey & Pierce, P.L.C.

(57) ABSTRACT

A piezoelectric device includes a piezoelectric element including a first electrode, a second electrode, and a piezoelectric layer provided between the first electrode and the second electrode, and a driving system that drives the piezoelectric element by applying voltage to the first electrode and the second electrode, in which the driving system drives the piezoelectric element at a maximum voltage that is lower than a voltage at which a tunnel current or a Poole-Frenkel current starts to be generated in the piezoelectric element.

4 Claims, 10 Drawing Sheets

(56) References Cited

U.S. PATENT DOCUMENTS

| | | | |
|---|---|---|---|
| 2009/0009031 A1* | 1/2009 | Nihei | H01L 41/042 310/317 |
| 2009/0223030 A1* | 9/2009 | Tsukamoto | B41J 2/155 29/25.35 |
| 2010/0225711 A1* | 9/2010 | Kato | B41J 2/14233 347/71 |
| 2011/0164097 A1 | 7/2011 | Nawano et al. | |
| 2012/0204550 A1* | 8/2012 | Al-Bender | F16F 15/005 60/420 |
| 2013/0100575 A1* | 4/2013 | O'Brien | H02N 2/181 361/283.1 |

FOREIGN PATENT DOCUMENTS

| | | | | |
|---|---|---|---|---|
| JP | 2010-201830 A | | 9/2010 | |
| JP | 2011-142122 A | | 7/2011 | |
| JP | 2012156160 A | * | 8/2012 | ............ H01L 41/09 |
| JP | 2013-159081 A | | 8/2013 | |
| JP | 2014-116625 A | | 6/2014 | |
| JP | 2014-172392 A | | 9/2014 | |
| JP | 2015-147330 A | | 8/2015 | |

* cited by examiner

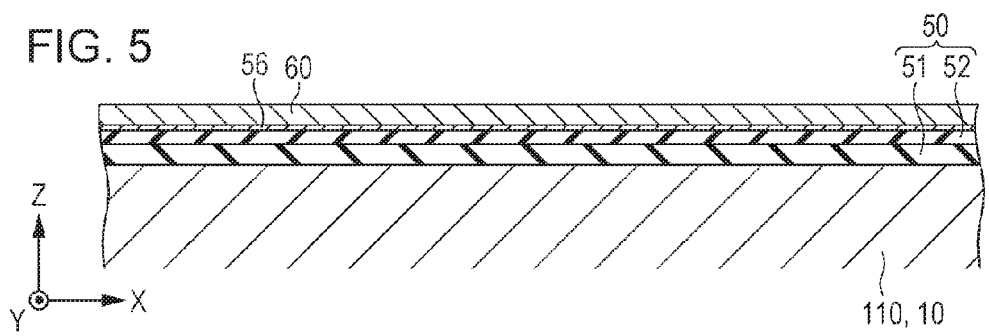
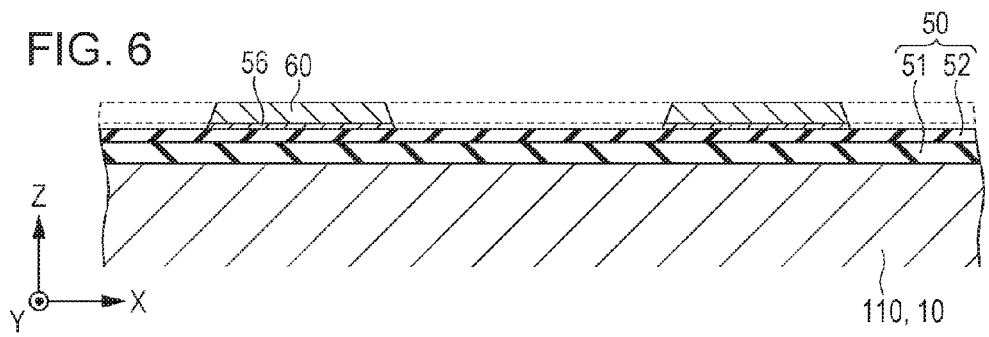
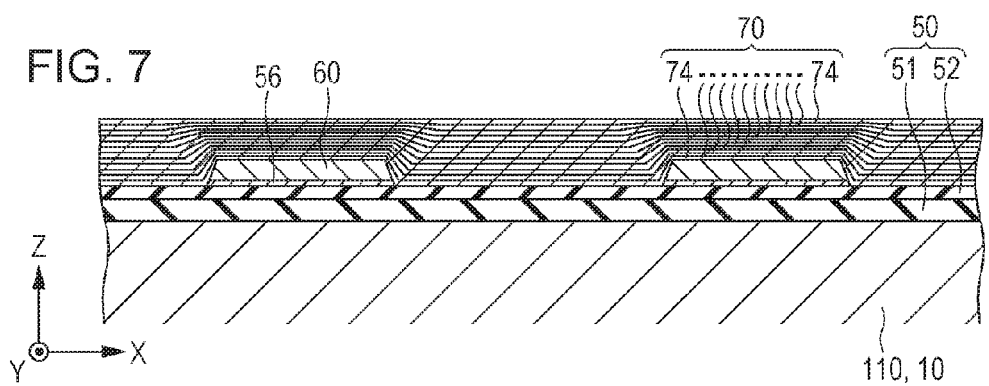
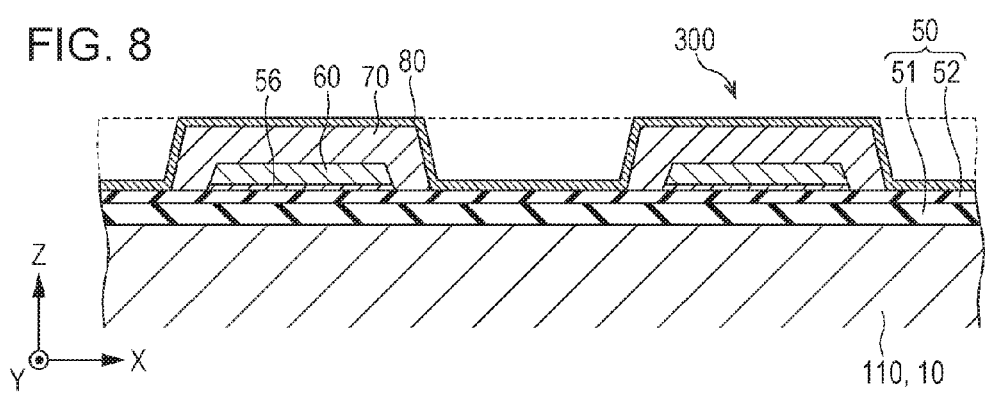

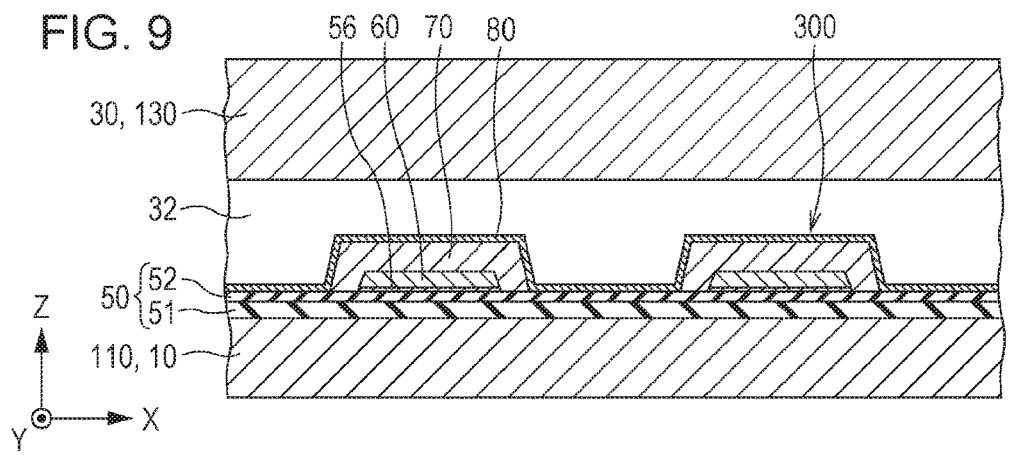
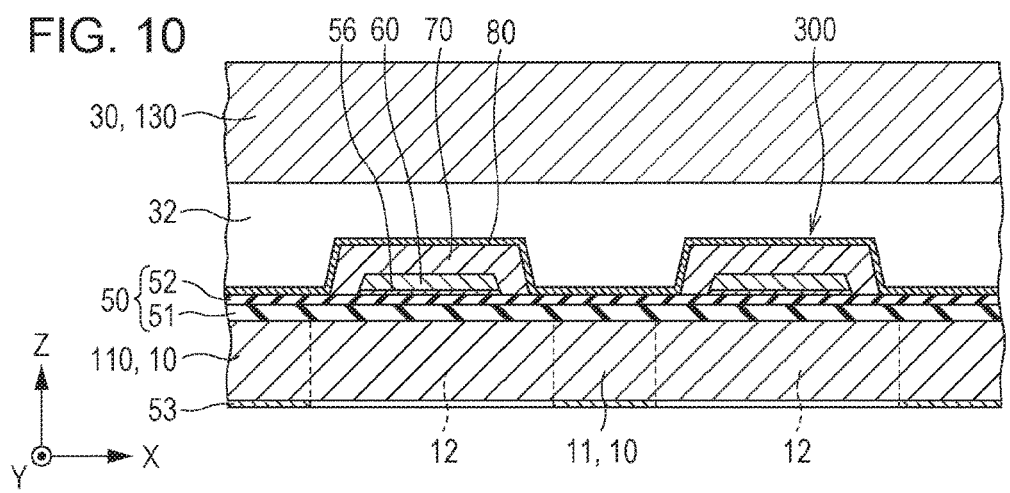
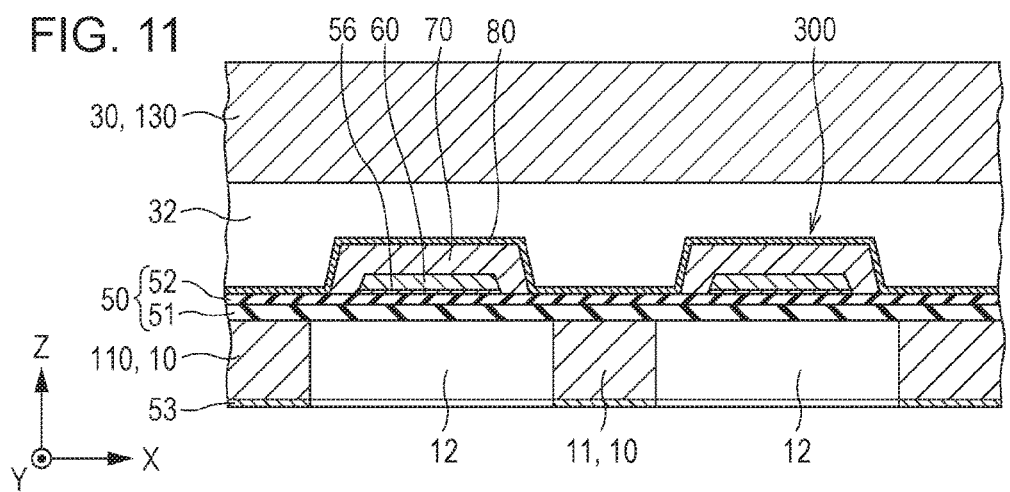

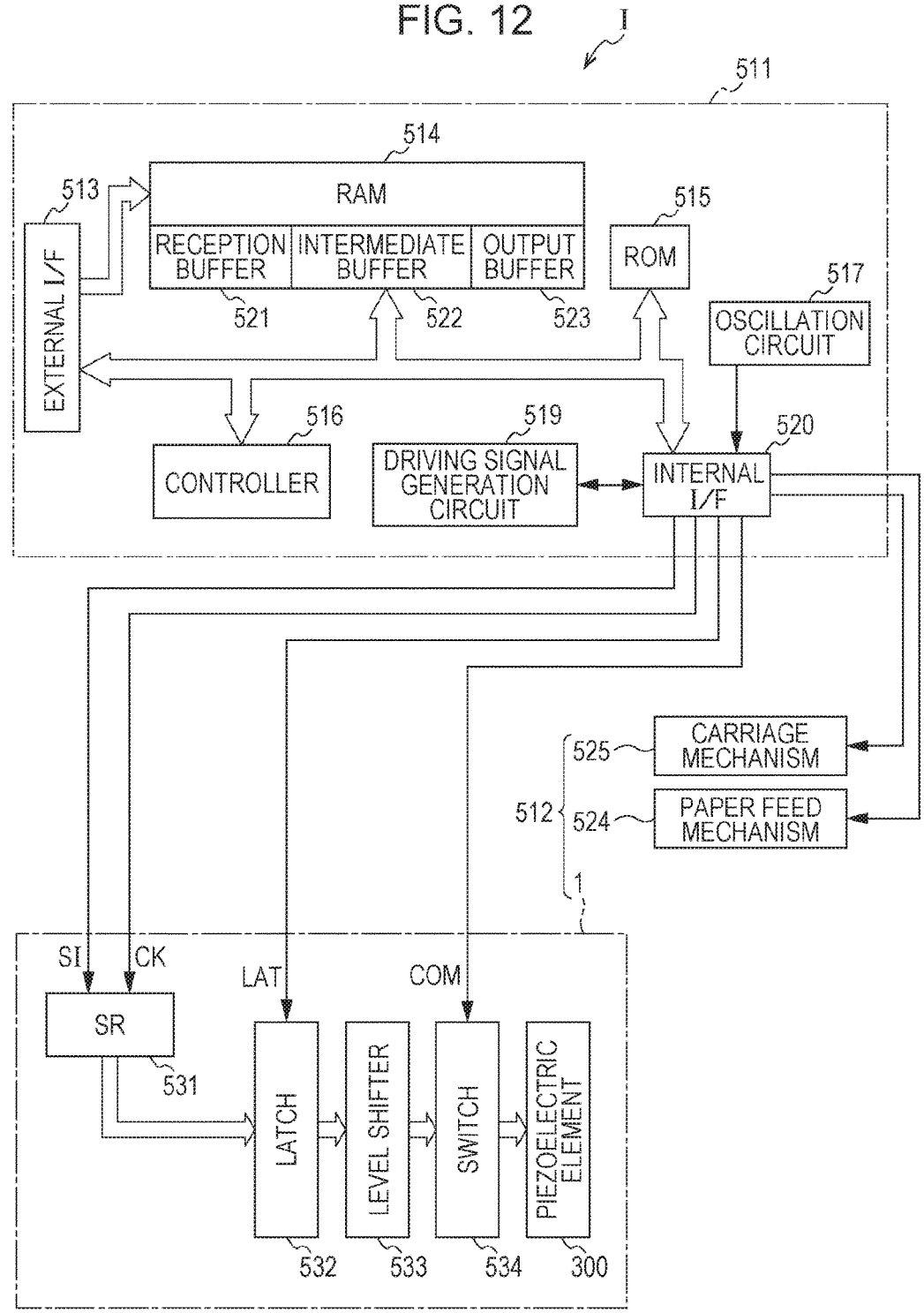

PIEZOELECTRIC DEVICE AND METHOD OF DRIVING PIEZOELECTRIC DEVICE

BACKGROUND

1. Technical Field

The present invention relates to a piezoelectric device and a method of driving a piezoelectric device.

2. Related Art

A piezoelectric element generally includes a piezoelectric layer having electromechanical conversion properties, and two electrodes through the piezoelectric layer. In recent years, a device using such a piezoelectric element as a driving source (piezoelectric device) has been actively developed. Examples of the piezoelectric device include a liquid ejecting head represented by an ink jet recording head, an MEMS factor represented by a piezoelectric MEMS element, an ultrasonic measuring apparatus represented by an ultrasonic sensor or the like, and a piezoelectric actuator apparatus.

For the piezoelectric layer, piezoelectric materials such as lead zirconate titanate ($Pb(Zr,Ti)O_3$, refer to as "PZT" below) and sodium potassium niobate (($K,Na)NbO_3$, refer to as "KNN" below) are used. To PZT, which is one of the piezoelectric materials, an excessive amount of lead (Pb) is added in order to secure piezoelectric properties. However, it is known that the excessive amount of Pb degrades voltage withstanding characteristics, and a method of driving a piezoelectric device and the structure of a piezoelectric element are devised to improve the voltage withstanding characteristics of PZT.

For example, JP-A-2013-159081 discloses a method of driving a piezoelectric device in which a driving waveform applied to a first electrode is a waveform in which voltage increases or decreases based on an intermediate voltage, and by applying a reference voltage which is higher than the intermediate voltage to a second electrode, a driving waveform having a relatively low intermediate voltage is applied to an individual electrode in a state in which a relatively high voltage is applied to a common electrode opposite to a pressure generating chamber. In addition, International Publication No. 2005/028207 discloses a piezoelectric element having a structure in which a pattern region of each layer at least configuring the piezoelectric element is covered by an insulating film made of an inorganic insulating material so that deterioration (breakage) of a piezoelectric layer (piezoelectric element) caused by an external environment such as moisture (humidity) is reliably prevented for a long period of time.

Generally, it is known that the voltage withstanding characteristics and the like of a piezoelectric material are degraded due to deterioration over time. However, in JP-A-2013-159081 and International Publication No. 2005/028207, methods for improving the voltage withstanding characteristics of a piezoelectric material are merely disclosed and there is no description of extending the service life by preventing degradation of voltage withstanding characteristics due to deterioration over time.

SUMMARY

An advantage of some aspects of the invention is to provide a piezoelectric device capable of extending the service life by preventing degradation of voltage withstanding characteristics due to deterioration over time to achieve a long service life and a method of driving a piezoelectric device.

According to an aspect of the invention, there is provided a piezoelectric device including a piezoelectric element including a first electrode, a second electrode, and a piezoelectric layer provided between the first electrode and the second electrode, and a driving system that drives the piezoelectric element by applying voltage to the first electrode and the second electrode, in which the driving system drives the piezoelectric element at a maximum voltage that is lower than a voltage at which a tunnel current or a Poole-Frenkel current starts to be generated in the piezoelectric element. In addition, the maximum voltage may be a maximum difference with a potential to be applied to the other electrode in a case in which a potential to be applied to one electrode is set as a reference potential.

According to the aspect of the invention, since a tunnel current or a Poole-Frenkel current can be prevented from being generated when the piezoelectric element is driven, it is possible to drive the piezoelectric element without breakage of the piezoelectric layer.

According to another aspect of the invention, there is provided a method of driving a piezoelectric device including applying voltage to a piezoelectric element including a first electrode, a second electrode, and a piezoelectric layer provided between the first electrode and the second electrode to drive the piezoelectric element, in which a maximum voltage that is lower than a voltage at which a tunnel current or a Poole-Frenkel current starts to be generated in the piezoelectric element is applied to drive the piezoelectric element.

According to the aspect of the invention, since the piezoelectric element can be driven at a maximum voltage lower than a voltage at which a tunnel current or a Poole-Frenkel current starts to be generated in the piezoelectric element in advance, the piezoelectric layer is not broken.

BRIEF DESCRIPTION OF THE DRAWINGS

The invention will be described with reference to the accompanying drawings, wherein like numbers reference like elements.

FIG. 5 is a view illustrating a manufacturing example of the ink jet recording head.

FIG. 6 is a view illustrating a manufacturing example of the ink jet recording head.

FIG. 7 is a view illustrating a manufacturing example of the ink jet recording head.

FIG. 8 is a view illustrating a manufacturing example of the ink jet recording head.

FIG. 9 is a view illustrating a manufacturing example of the ink jet recording head.

FIG. 10 is a view illustrating a manufacturing example of the ink jet recording head.

FIG. 11 is a view illustrating a manufacturing example of the ink jet recording head.

FIG. 12 is a block diagram showing an example of a control configuration of the ink jet recording apparatus.

DESCRIPTION OF EXEMPLARY EMBODIMENTS

Figure 1:
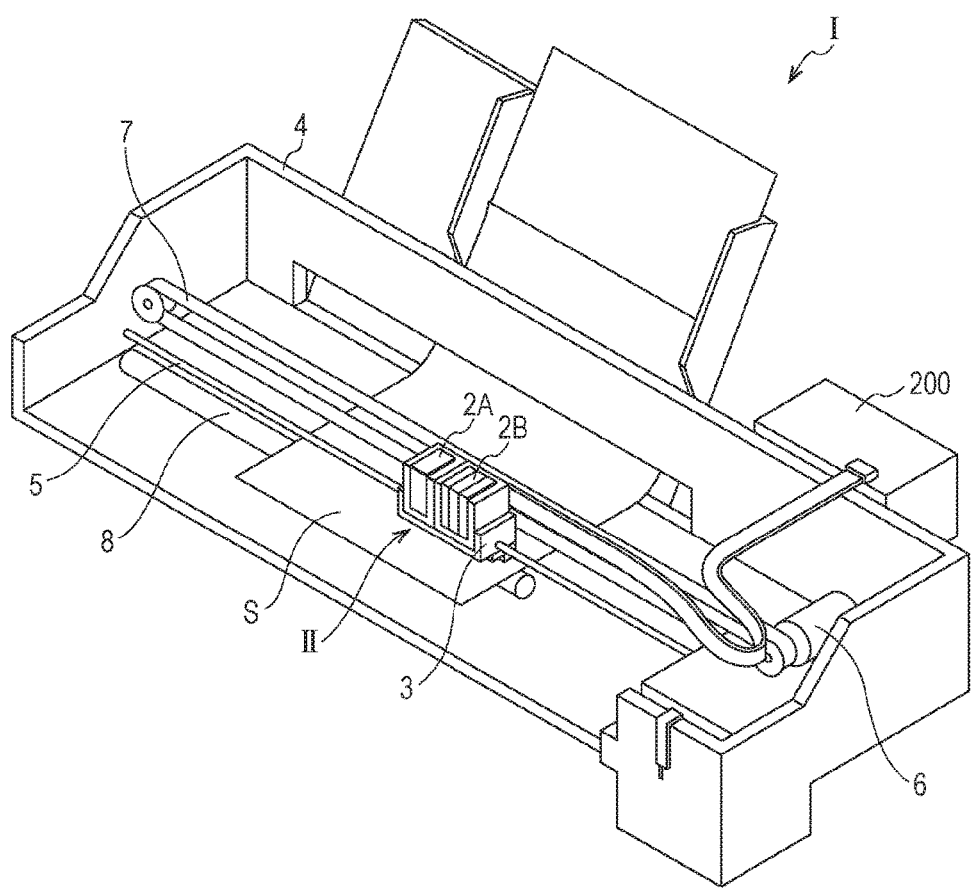
FIG. 1 is a view showing a schematic configuration of an ink jet recording apparatus.

Hereinafter, embodiments of the invention will be described with reference to the drawings. In the following description, one example of the invention is shown and arbitrary modifications can be made within a range not departing from the gist of the invention. It should be noted that constituent elements denoted by the same reference numerals in each drawing are the same members and the descriptions thereof will be appropriately omitted. In addition, in FIGS. 2 to 11, X, Y, and Z represent three spatial axes orthogonal to one another. In the specification, directions along these axes are respectively described as a first direction X (X direction), a second direction Y (Y direction), and a third direction Z (Z direction). The X direction and the Y direction represent an in-plane direction of a plate, a layer, or a film and the Z direction represents a thickness direction of a plate, a layer, or a film, or a lamination direction.

First Embodiment

First, an ink jet recording apparatus which is an example of a liquid ejecting apparatus will be described with reference to FIG. 1.

FIG. 1 shows a schematic configuration of an ink jet recording apparatus. As shown in the drawing, in an ink jet recording apparatus (recording apparatus I), an ink jet recording head unit (head unit II) is detachably attached to cartridges 2A and 2B. The cartridges 2A and 2B constitute an ink supply unit. The head unit II has plural ink jet recording heads (recording heads 1), which will be described later in detail, and is mounted on a carriage 3. The carriage 3 is provided on a carriage shaft 5 that is attached to an apparatus main body 4 to be freely movable in the shaft direction. The head unit II and the carriage 3 are configured to discharge, for example, a black ink composition and a color ink composition, respectively.

The carriage 3 on which the head unit II is mounted is moved along the carriage shaft 5 by a driving force of a driving motor 6 being transmitted to the carriage 3 through plural gears (not shown) and a timing belt 7. On the other hand, a transport roller 8 is provided as a transport unit in the apparatus main body 4. A recording sheet S, which is a recording medium such as paper, is transported by the transport roller 8. The transport unit that transports the recording sheet S is not limited to the transport roller and may be a belt, a drum, and the like.

In the recording head 1, a piezoelectric element 300 according to the embodiment of the invention, which will be described later in detail, is used as a piezoelectric actuator apparatus. By using the piezoelectric element 300, degradation in various properties (durability, ink ejecting properties, and the like) in the recording apparatus I can be avoided.

Figure 3:
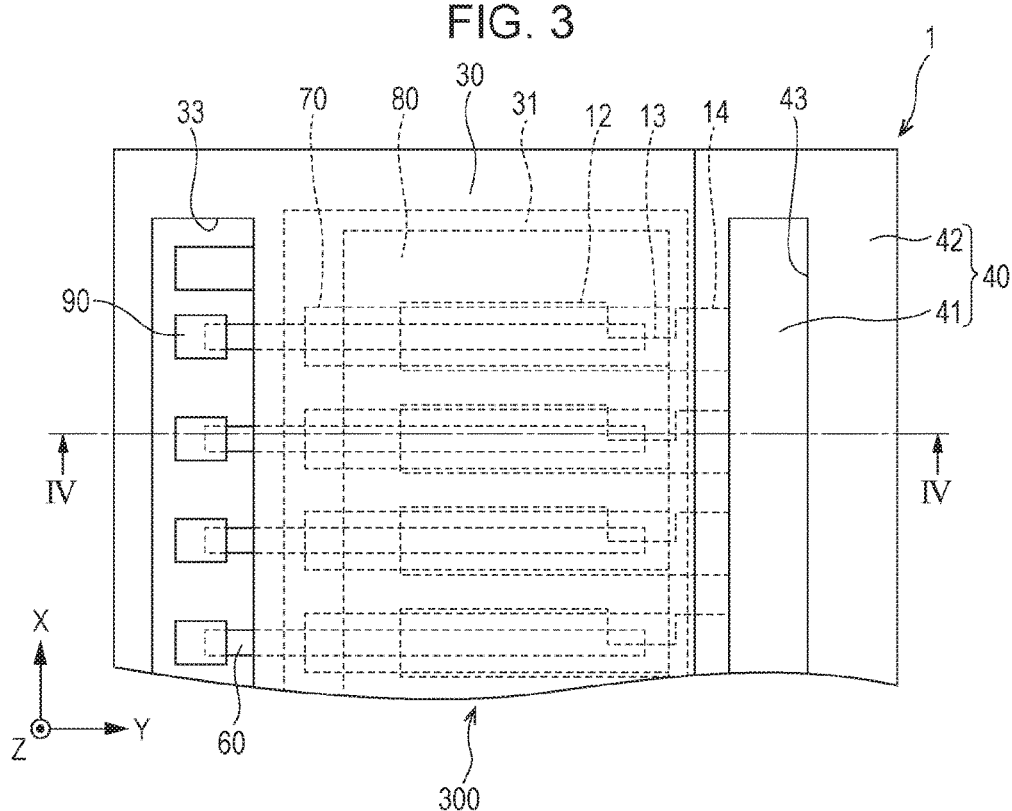
FIG. 3 is a plan view showing the schematic configuration of the ink jet recording head.
Figure 4:
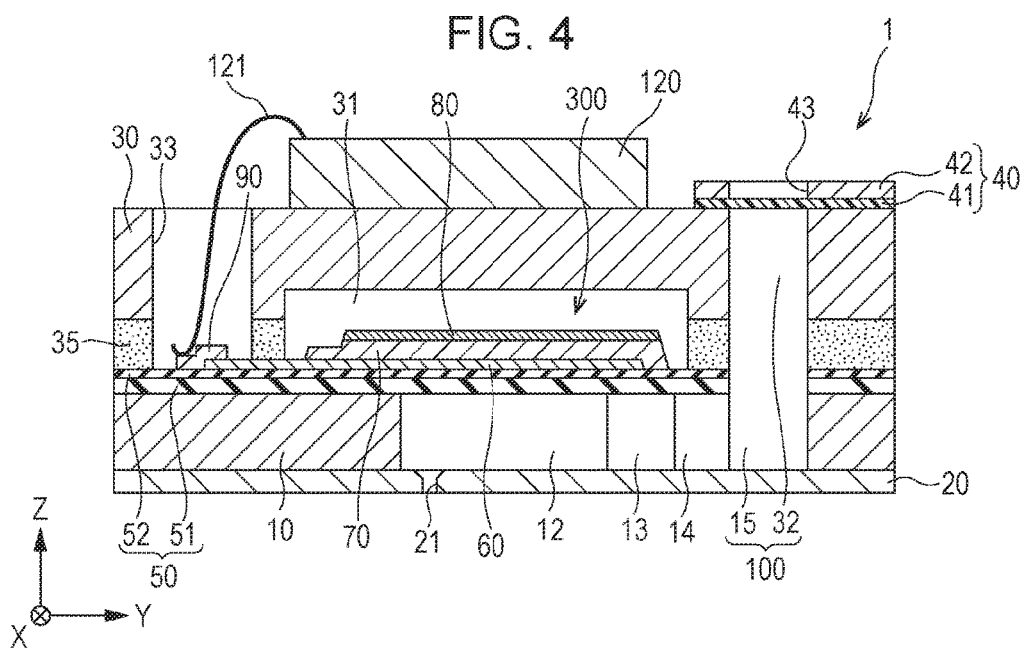
FIG. 4 is a cross-sectional view showing the schematic configuration of the ink jet recording head.

Next, the ink jet recording head which is mounted on the liquid ejecting apparatus as an example of a liquid ejecting head will be described with reference to FIGS. 2 to 4.

Figure 2:
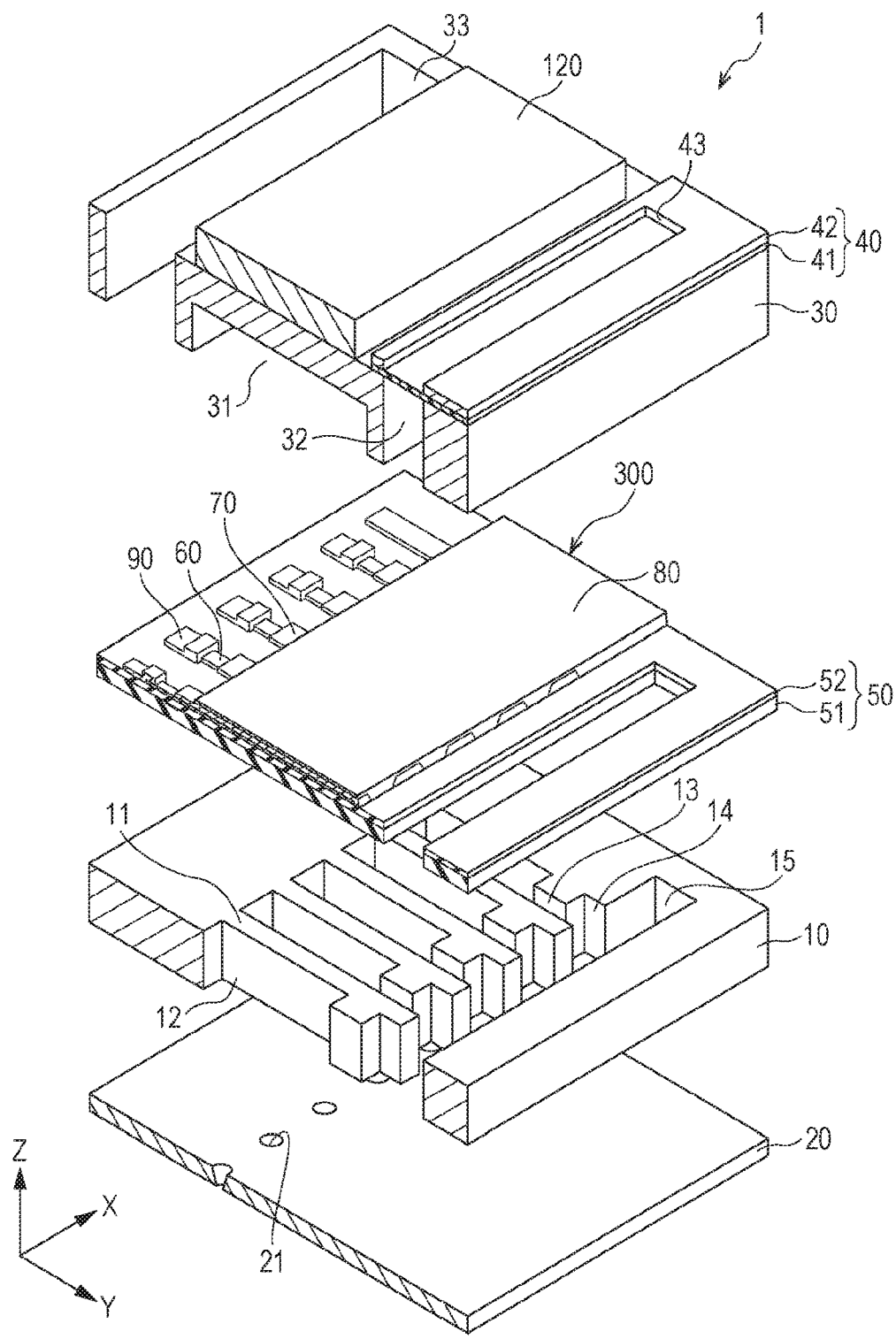
FIG. 2 is an exploded perspective view showing a schematic configuration of an ink jet recording head.

FIG. 2 is an exploded perspective view showing an ink jet recording head. FIG. 3 is a plan view showing a flow path forming substrate on the side close to the piezoelectric element (a plane view of a flow path forming substrate when viewed from the side close to the piezoelectric element), and FIG. 4 is a cross-sectional view taken along the line IV-IV in FIG. 3.

As shown in the drawings, in a flow path forming substrate 10 (hereinafter, referred to as a "substrate 10"), pressure generation chambers 12 are formed. The pressure generation chambers 12 which are partitioned by plural partition walls 11 are provided in parallel in a direction (X direction) in which plural nozzle openings 21 which discharge the same ink are provided in parallel. The substrate 10 can be formed using, for example, a material such as a silicon monocrystal substrate, a SOI substrate, glass ceramic, and stainless steel.

At one end of the substrate 10 in the Y direction of the pressure generation chambers 12, ink supply paths 13 that are formed by narrowing one side of each of the pressure generation chambers 12 from the X direction so as to reduce an opening area, and communication paths 14 that have almost the same width as the width of the pressure generation chambers 12 in the X direction are partitioned by the plural partition walls 11. A communication portion 15 that constitutes a part of a manifold 100 functioning as an ink chamber common to each of the pressure generation chambers 12 is formed on the outside of the communication paths 14 (the opposite side of the pressure generation chambers 12 in the Y direction). That is, a liquid flow path configured of the pressure generation chambers 12, the ink supply paths 13, the communication paths 14, and the communication portion 15 is formed in the substrate 10.

A nozzle plate 20 having nozzle openings 21 which communicates with each pressure generation chamber 12 is bonded to one surface of the substrate 10 (−Z direction), that is, to a surface in which the liquid flow path such as the pressure generation chamber 12 is opened, using an adhesive or a heat-fusible film. The nozzle plate 20 has the nozzle openings 21 provided in parallel in the X direction. The nozzle plate 20 is formed using, for example, a material, such as glass ceramic, a silicon monocrystal substrate, or stainless steel.

A vibration plate 50 is formed on the other surface opposite to one surface of the substrate 10 (+Z direction). The vibration plate 50 can be configured of, for example, an elastic film 51 that is provided on the substrate 10, and an insulating film 52 that is provided on the elastic film 51. The elastic film 51 is made of, for example, silicon dioxide ($SiO_2$), and the insulating film 52 is made of, for example, zirconium oxide ($ZrO_2$).

The elastic film 51 may not be a member separate from the substrate 10. A part of the substrate 10 is processed to be thin and the processed substrate can be used as the elastic film 51. The insulating film 52 functions as a stopper for preventing the crystals from passing through a first electrode 60 and reaching the substrate 10 in the case in which a piezoelectric layer 70 includes potassium (K) and sodium (Na) as constituent elements when the piezoelectric layer 70, which will be described later in detail, is formed.

A piezoelectric element 300 having a configuration in which the first electrode 60, the piezoelectric layer 70, and a second electrode 80 are sequentially laminated on the insulating film 52 is formed. In addition, although not shown in FIGS. 2 to 4, in order to enhance adhesion between the insulating film 52 and the first electrode 60, an adhesion layer 56 (refer to FIGS. 5 to 11) is provided between the insulating film 52 and the first electrode 60. The adhesion layer 56 may be omitted. The piezoelectric element 300 includes not only the part having the first electrode 60, the piezoelectric layer 70, and the second electrode 80 but also a part at least having the piezoelectric layer 70.

In the embodiment, the piezoelectric element 300 and the vibration plate 50 that is displaced with the driving of the piezoelectric element 300 are collectively called an actuator apparatus. More specifically, the vibration plate 50 and the first electrode 60 are displaced by the displacement of the piezoelectric layer 70 having electromechanical conversion properties. That is, in the actuator apparatus, the vibration plate 50 and the first electrode 60 substantially function as the vibration plate. However, there is no limitation thereto. Only the first electrode 60 may function as the vibration plate without providing either or both of the elastic film 51 and the insulating film 52. Further, the piezoelectric element 300 itself may substantially function as the vibration plate. In the case in which the first electrode 60 is directly provided on the substrate 10, and it is preferable that the first electrode 60 is protected by a protective film for insulation properties and the like so as to prevent conduction between the first electrode 60 and an ink.

In such a piezoelectric element 300, generally, one of the electrodes is set to a common electrode and the other electrode is set as an individual electrode that is obtained by patterning each of the pressure generation chambers 12 (hereinafter, referred to as an "individual electrode"). Although described later in detail, in the embodiment, the first electrode 60 is set to an individual electrode and the second electrode 80 is set to a common electrode. However, a set of a driving circuit 120 and a connecting wire 121 may be reversed. In the embodiment, the second electrode 80 is set to a common electrode by continuously forming the electrode over the plural pressure generation chambers 12.

The first electrode 60 configuring the piezoelectric element 300 is provided in every region opposite to each of the pressure generation chambers 12 with a width narrower than the width of the pressure generation chamber 12. In addition, the first electrode 60 extends from one end of each of the pressure generation chambers 12 in the longitudinal direction to the peripheral wall. Lead electrodes 90 made of, for example, gold (Au), are respectively connected to the first electrodes 60 in a region outside of each of the pressure generation chambers 12 and voltage is selectively applied to each of the piezoelectric elements 300 through the lead electrodes 90. That is, the first electrode 60 functions as an individual electrode as described above. On the other hand, the end of the first electrode 60 at the other end of the pressure generation chamber 12 in the longitudinal direction is positioned in a region opposite to the pressure generation chamber 12.

The piezoelectric layer 70 is provided with a width wider than the width of the first electrode 60 and narrower than the width of the pressure generation chamber 12. In the longitudinal direction of the pressure generation chamber 12, the both ends of the piezoelectric layer 70 extend to the outside of the end of the pressure generation chamber 12. That is, the piezoelectric layer 70 is provided so as to completely cover the upper surface and the end surface of the first electrode 60 in the region opposite to the pressure generation chamber 12. The end of the piezoelectric layer 70 on the other end of the pressure generation chamber 12 in the longitudinal direction is positioned in the vicinity of the end of the pressure generation chamber 12, and the first electrode 60 further extends in the region outside thereof.

The piezoelectric layer 70 is formed using a piezoelectric material made of a complex oxide having a perovskite structure which is represented by Formula $ABO_3$. In the A-site of the complex oxide having a perovskite structure which is represented by Formula $ABO_3$, oxygen is 12-coordinated, while in the B-site thereof, oxygen is 6-coordinated so as to form an octahedron.

In the embodiment, the complex oxide that can be used as a piezoelectric material is, for example, lead zirconate titanate (PZT) represented by the following Formula (1).

$$Pb(Zr,Ti)O_3 \qquad (1)$$

In the A-site of PZT, lead (Pb) is located and zirconium (Zr), while in the B-site thereof, titanium (Ti) are located. PZT is advantageous to improve the displacement of the piezoelectric layer 70 since the piezoelectric properties are relatively high.

In addition, other complex oxides that can be used as a piezoelectric material are, for example, compounds represented by the following Formulae (2) to (4).

$$(K,Na)NbO_3 \qquad (2)$$

$$BiFeO_3 \qquad (3)$$

$$(Bi,Ba)(Fe,Ti)O_3 \qquad (4)$$

In the A-site of the complex oxide represented by Formula (2) (so-called KNN-based complex oxide), potassium (K) and sodium (Na) are located, while in the B-site thereof, niobium (Nb) is located. In the A-site of the complex oxide represented by Formula (3) (so-called BFO-based complex oxide), bismuth (Bi) is located, while in the B-site thereof, iron (Fe) is located. In the A-site of the complex oxide represented by Formula (4) (so-called BF-BT-based complex oxide), bismuth (Bi) and barium (Ba) are located, while in the B-site thereof, iron (Fe) and titanium (Ti) are located.

The piezoelectric layer 70 made of the complex oxides represented by Formulae (2) to (4) is formed using a material in which the content of Pb is suppressed or a material in which Pb is not used (so-called lead free piezoelectric material). Therefore, compared to the piezoelectric layer 70 mainly containing Pb, an environmental load can be reduced.

However, the piezoelectric material that can be used in the embodiment is not limited by the scope of the invention. In the complex oxides represented by Formulae (1) to (4), the A-site and the B-site may include other elements. Examples of the element to be included in the A-site include lanthanum (La), samarium (Sm), and cerium (Ce), in addition to the above Pb, K, Na, Bi, and Ba. Examples of the element to be included in the B-site include manganese (Mn), aluminum (Al), and cobalt (Co), in addition to the above Zr, Ti, Nb, and Fe. That is, within the scope of the invention, the piezoelectric layer 70 may include materials other than the complex oxides represented Formulae (1) to (4).

That is, the piezoelectric material also includes a material having a composition in which a part of the elements is deficient, a material having a composition in which a part of the elements is excessive, and a material having a composition in which a part of the elements is substituted with another element. In addition, as long as the basic properties of the piezoelectric layer 70 do not change, the piezoelectric material of the embodiment includes a material having a composition shifted from a stoichiometric composition ratio due to deficiency, excessiveness, or the like, and a material in which a part of the elements is substituted with another element.

The second electrode 80 is continuously formed in the region opposite to the plural pressure generation chambers 12 and functions as a common electrode as described above. In addition, the second electrode 80 extends from the other end of each of the pressure generation chamber 12 in the longitudinal direction to the peripheral wall. That is, the second electrode 80 is provided to substantially completely cover the upper surface and the end surface of the piezoelectric layer 70 in the region opposite to the pressure generation chamber 12. At the time of driving the element, voltage is applied to the piezoelectric layer 70 in a region in which the first electrode 60 overlaps with the second electrode 80. Since the upper surface and the end surface in the region (driving portion) are covered by the second electrode, moisture (humidity) in the atmosphere is prevented from entering the piezoelectric layer 70 with driving. Therefore, the piezoelectric element 300 (the piezoelectric material layer 70) can be prevented from being broken due to moisture, and the durability of the piezoelectric element 300 can be significantly improved.

The material for the first electrode 60 and the second electrode 80 is not particularly limited as long as the material is conductive. For example, noble metals such as platinum (Pt) and iridium (Ir) may be preferably used.

A protective substrate 30 having a manifold portion that constitutes at least part of the manifold 100 is bonded to the substrate 10 on which the piezoelectric element 300 is provided, that is, to the vibration plate 50, the first electrode 60, and the lead electrode 90, with an adhesive 35. In the embodiment, the manifold portion 32 is formed in the width direction of the pressure generation chamber 12 to pass through the protective substrate 30 in the thickness direction. The manifold portion communicates with the communication portion 15 of the substrate 10 as described above to constitute the manifold 100 functioning as an ink chamber common to each of the pressure generation chambers 12. In addition, the communication portion 15 of the substrate 10 may be partitioned into portions for each pressure generation chamber 12 and only the manifold portion 32 may function as the manifold 100. Further, for example, only the pressure generation chambers 12 may be provided in the substrate 10, and the elastic film 51 and the insulating film 52 interposed between the substrate 10 and the protective substrate 30 may be provided with the ink supply paths 13 communicating the manifold 100 with each of the pressure generation chambers 12.

A piezoelectric element holding portion 31 having such a space as not to disturb the driving of the piezoelectric element 300 is provided in a region in the protective substrate 30 opposite to the piezoelectric element 300. The piezoelectric element holding portion 31 may have such a space as not to disturb the driving of the piezoelectric element 300, and the space may be sealed, or may not be sealed. The driving circuit 120 functions as a signal processing unit is fixed to the protective substrate 30. As the driving circuit 120, for example, a circuit board, a semiconductor integrated circuit (IC), or the like may be used. The driving circuit is connected to a printer controller 200 (refer to FIG. 1). The driving circuit 120 and the lead electrode 90 can be electrically connected through connection wiring 121 made of conductive wires such as bonding wires inserted into a through hole 33. In the embodiment, such a driving circuit 120 functions as a control unit for an actuator apparatus (piezoelectric element 300).

As the material for the protective substrate 30, for example, glass, a ceramic material, a metal, resin, or the like may be used. It is more preferable to use a material having the substantially same thermal expansion coefficient as the substrate 10. In the embodiment, the protective substrate 30 is formed using a silicon monocrystal substrate, which is the same material as the substrate 10.

A compliance substrate 40 formed of a sealing film and a stationary plate 42 is bonded to the protective substrate 30. The sealing film 41 is made of a flexible material having low rigidity and one surface of the manifold portion 32 is sealed with the sealing film 41. In addition, the stationary plate 42 can be made of a hard material such as metal. A region in the stationary plate 42 opposite to the manifold 100 is an opening portion 43 completely removed in the thickness direction, and thus one surface of the manifold 100 is sealed with only the sealing film 41 having flexibility.

In the ink jet recording head (recording head 1) having the above-described configuration, an ink is introduced from an external ink supply unit (not shown) and the inside of the manifold 100 to the nozzle openings 21 is filled with the ink. Thereafter, according to a recording signal sent from a driving IC (not shown), a voltage is applied to each piezoelectric element 300 corresponding to each of the pressure generation chambers 12, so as to bend and deform the piezoelectric element 300. Thus, the pressure inside each pressure generation chamber 12 increases so that an ink droplet is discharged from the nozzle opening 21.

Next, an example of a method of manufacturing the piezoelectric element to be mounted on the ink jet recording head will be described together with a method of manufacturing the ink jet recording head with reference to FIGS. 5 to 11.

In addition, as shown in FIG. 5, a silicon substrate 110 (substrate 10) is prepared. Next, the silicon substrate 110 is thermally oxidized to form the elastic film 51 made of silicon dioxide ($SiO_2$) on the surface thereof. Further, a zirconium film is formed on the elastic film 51 by a sputtering method, and the film is thermally oxidized to obtain the insulating film 52 made of zirconium oxide ($ZrO_2$). In this manner, the vibration plate 50 formed of the elastic film 51 and the insulating film 52 is formed.

The conditions for film formation when the zirconium film is formed by the sputtering method are such that the substrate temperature is preferably room temperature (RT) or higher and 350° C. or lower, and more preferably at 250° C. or higher and 350° C. or lower, the pressure is preferably 0.02 Pa or higher and 1.0 Pa or lower, and more preferably 0.5 Pa or higher and 0.8 Pa or lower. In addition, the temperature when the formed zirconium film is thermally oxidized is not particularly limited as long as zirconium oxide can be obtained through thermal oxidation of the zirconium film. The temperature is preferably about 700° C. to 900° C. and more preferably about 700° C. to 800° C.

In the piezoelectric element 300 including the insulating film 52 obtained by thermally oxidizing the zirconium film formed under the conditions for film formation, a voltage at which a tunnel current (FN: Fowler-Nordheim, referred to as a "FN current" below) starts to be generated (referred to as a "FN current starting voltage" below), which will be described later, is, for example, 38 V or a voltage at which a Poole-Frenkel current (PF, referred to as a "PF current" below) starts to be generated (referred to as a "PF current starting voltage" below) is, for example, V. Thus, when a maximum voltage lower than the FN current starting voltage or the PF current starting voltage is applied to the piezoelectric element 300, the generation of a tunnel current or a Poole-Frenkel current can be prevented. As a result, it is possible to drive the piezoelectric element 300 without breaking the piezoelectric layer 70 for a long period of time. That is, it is possible to extend the service life of the piezoelectric device by preventing degradation of voltage withstanding characteristics due to deterioration over time and achieve a long service life. Although the details will be described later, the maximum voltage is a maximum value of a voltage to be applied to the first electrode 60 or the second electrode 80.

Next, the adhesion layer 56 made of titanium oxide ($TiO_x$) is formed on the insulating film 52. The adhesion layer 56 can be formed by a sputtering method, thermal oxidation, or the like. However, the adhesion layer 56 can be omitted. Next, the first electrode 60 is formed on the adhesion layer 56. The first electrode 60 can be formed by, for example, a gas phase film formation such as a sputtering method, a physical vapor deposition (PVD method), or a laser ablation method, liquid phase film formation such as spin coating, and the like.

Next, as shown in FIG. 6, the adhesion layer 56 and the first electrode 60 are patterned at the same time. The patterning of the adhesion layer 56 and the first electrode 60 can be carried out by, for example, dry etching such as reactive ion etching (RIE) or ion milling, and wet etching using an etching solution. The shape of the patterning of the adhesion layer 56 and the first electrode 60 is not particularly limited.

Next, as shown in FIG. 7, the piezoelectric layer 70 is formed. A method of forming the piezoelectric layer 70 is not limited. For example, a chemical solution method (wet method), such as a metal-organic decomposition (MOD) method including applying a solution including a metal complex and further carrying out baking at a high temperature to obtain a metal oxide, or a sol-gel method can be used. In addition, a liquid phase method or a solid phase method such as a laser ablation method, a sputtering method, a pulse laser deposition method (PLD method), a chemical vapor deposition (CVD) method, or an aerosol deposition method, can be used to manufacture the piezoelectric layer 70.

The piezoelectric layer 70 formed by a wet method has plural piezoelectric films 74 formed by a series of processes from a process of applying a precursor solution (coating process) to a process of baking a precursor film (baking process). That is, the piezoelectric layer 70 is formed by repeating the series of processes from the coating process to the baking process plural times. In the series of processes from the coating process to the baking process, the baking process may be carried out after processes from the coating process to the degreasing process are repeated plural times.

An example of the specific forming procedure in the case in which the piezoelectric layer 70 is formed by a wet method is as follows. First, a precursor solution which is made of a MOD solution or sol including a metal complex and used for forming the piezoelectric layer 70 is prepared. Then, the precursor solution is applied to the first electrode 60 using a spin coating method or the like to form a precursor film (coating process). Next, the precursor film is heated to a predetermined temperature, for example, about 130° C. to 250° C., and dried for a predetermined period of time (drying process). The precursor film which has been further dried is heated to a predetermined temperature, for example, about 300° C. to 450° C. and held for a predetermined period of time so as to be degreased (degreasing process). Further, the degreased precursor film is heated to a higher temperature, for example, about 650° C. to 800° C. and held for a predetermined period of time so that the precursor film is crystallized to form a piezoelectric film 74 (baking process). Then, the above coating process, drying process, degreasing process, and baking process are repeatedly carried out plural times to form the piezoelectric layer 70 formed of plural piezoelectric films 74 shown in FIG. 7.

The above-described precursor solution is obtained by dispersing metal complexes capable of forming complex oxides having a perovskite structure represented by Formula $ABO_3$ through baking in an organic solvent. At this time, in addition, to the elements that can be included in the A-site and the B-site, metal complexes including additives such as Mn and Mg may be further mixed.

As the metal complexes that can be included in the A-site and the B-site, for example, alkoxide, organic salt, β-disketone complex, and the like can be used. The mixing ratio of these metal complexes may be set such that each metal is mixed at a predetermined molar ratio.

Examples of the metal complex including Pb include lead acetate. Examples of the metal complex including Zr include zirconium acetyl acetonate, zirconium tetraacetyl acetonate, zirconium monoacetyl acetonate, and zirconium bisacetyl acetonate. Examples of the metal complex including Ti include tantalum alkoxide such as titanium isopropoxide. Examples of the metal complex including K include potassium carbonate and potassium acetate. Examples of the metal complex including Na include sodium carbonate and sodium acetate. Examples of the metal complex including Nb include niobium ethoxide. At this time, two or more metal complexes may be used in combination. For example, as the metal complex including K, potassium carbonate and potassium acetate may be used in combination.

Examples of a solution of a metal complex include propanol, butanol, pentanol, hexanol, octanol, ethylene glycol, propylene glycol, octane, decane, cyclohexane, xylene, toluene, tetrahydrofuran, acetic acid, octylic acid, 2-n-butoxyethanol, n-octane, or a mixed solution thereof. The precursor solution may include an additive for stabilizing dispersion of metal complexes including Pb, Zr, Ti, K, Na, and Nb. As such an additive, 2-ethylhexanoic acid may be used.

In addition, as a heating apparatus used in the drying process, the degreasing process, and the baking process, for example, a rapid thermal annealing (RTA) apparatus that carries out heating with irradiation from an infrared lamp, a hot plate, and the like may be used.

Next, as shown in FIG. 8, the piezoelectric layer 70 formed of the plural piezoelectric films 74 is patterned. The patterning can be carried out by so-called dry etching, such as reactive ion etching or ion milling, or wet etching using an etching solution. The shape of the patterning of the piezoelectric layer 70 is not particularly limited. Thereafter, the second electrode 80 is formed on the piezoelectric layer 70. The second electrode 80 can be formed in the same manner as in the formation of the first electrode 60. Through the above processes, the piezoelectric element 300 including the first electrode 60, the piezoelectric layer 70, and the second electrode 80 is finished. In other words, a portion in which the first electrode 60, the piezoelectric layer 70, and the second electrode 80 are overlapped serves as the piezoelectric element 300.

Next, as shown in FIG. 9, a wafer 130 for a protective substrate (protective substrate 30) is bonded to the surface of the silicon substrate 110 close to the piezoelectric element 300 with an adhesive (not shown). Thereafter, the surface of the wafer 130 for a protective substrate is cut off to be thinned. In addition, the manifold portion 32 and the through hole 33 (not shown) (refer to FIG. 2) are formed in the wafer 130 for a protective substrate. Next, as shown in FIG. 10, a mask film 53 is formed on the surface of the silicon substrate 110 opposite to the piezoelectric element 300 and is patterned into a predetermined shape. Then, as shown in FIG. 11, anisotropic etching (wet etching) is carried out on the silicon substrate 110 through the mask film 53 using an alkali solution such as KOH or the like. Through this, in addition to the pressure generation chambers 12 corresponding to the individual piezoelectric elements 300, the ink supply paths 13, the communication paths 14, and the communication portion 15 (not shown) (refer to FIG. 2) are formed.

Next, the unnecessary portion of the outer peripheral edge of the silicon substrate 110 and the wafer 130 for a protective substrate is curt and removed by dicing or the like. Further, the nozzle plate 20 is bonded to the surface of the silicon substrate 110 opposite to the piezoelectric element 300 (refer to FIG. 2). In addition, the compliance substrate 40 is bonded to the wafer 130 for a protective substrate (refer to FIG. 2). Through these processes, an aggregate of chips of the recording head 1 is completed. The aggregate is separated into individual chips and thus the recording head 1 (refer to FIGS. 2 to 4) is obtained.

Next, the control of the ink jet recording apparatus will be described with reference to FIG. 12.

FIG. 12 is a block diagram showing an example of a control configuration of the ink jet recording apparatus. As shown in the drawing, the ink jet recording apparatus (recording apparatus I) is configured of a printer controller 511 and a print engine 512. The printer controller 511 includes an external interface 513 (hereinafter, referred to as an "external I/F 513"), a RAM 514 that temporarily stores various kinds of data, a ROM 515 that stores a control program or the like, a controller 516 configured of a CPU and the like, an oscillation circuit 517 that generates a clock signal, a driving signal generation circuit 519 that generates a driving signal to be supplied to the ink jet recording head 1, and an internal interface 520 (hereinafter, referred to as "an internal I/F 520") that sends dot-pattern data (bit-map data) which is created based on the driving signal and print data, and the like to the print engine 512.

The external I/F 513 receives print data configured of, for example, character codes, graphics functions, image data or the like from a host computer (not shown) or the like. In addition, a busy signal (BUSY), an acknowledge signal (ACK), and the like are outputted to the host computer or the like through the external I/F 513.

The RAM 514 functions as a reception buffer 521, an intermediate buffer 522, an output buffer 523 and a working memory (not shown). The reception buffer 521 temporarily stores the print data received by the external I/F 513, the intermediate buffer 522 stores intermediate code data converted by the controller 516, and the output buffer 523 stores dot-pattern data. Note that the dot-pattern data is configured of printing data obtained by decoding (translating) the tone data.

Font data, graphics functions and the like are stored in the ROM 515, in addition to the control program (control routine) for executing various kinds of data processing.

The controller 516 reads out the print data in the reception buffer 521 and stores the intermediate code data obtained by converting the print data in the intermediate buffer 522. In addition, the controller 516 analyzes the intermediate code data read out from the intermediate buffer 522, and creates the dot-pattern data from the intermediate code data referring to the font data, the graphics functions and the like that are stored in the ROM 515. Then, the controller 516 performs essential decoration processing on the created dot-pattern data, and thereafter stores the created dot-pattern data in the output buffer 523. Further, the controller 516 also functions as a waveform setting unit and controls the driving signal generation circuit 519 to set the shape of a waveform of the driving signal outputted from the driving signal generation circuit 519. The controller 516 in combination with a driving circuit (not shown) or the like, which will be described later, constitutes a driving unit. Further, as a recording apparatus I that drives the recording head 1, it is sufficient to include at least this driving unit. Accordingly, in this embodiment, the driving unit includes the printer controller 511.

When one line's worth of dot-pattern data of the recording head 1 is obtained, this one line's worth of dot-pattern data is outputted to the recording head 1 through the internal I/F 520. When one line's worth of dot-pattern data is outputted from the output buffer 523, the created intermediate code data is erased from the intermediate buffer 522, and the subsequent intermediate code data is subjected to the creation processing.

The print engine 512 is configured to include the recording head 1, a paper feed mechanism 524, and a carriage mechanism 525. The paper feed mechanism 524 is configured of a paper feed motor, a platen and the like, and feeds out print recording media such as recording sheets S one after the other in cooperation with recording operation of the recording head 1. In other words, the paper feed mechanism 524 relatively moves the print recording media in a sub scanning direction.

The carriage mechanism 525 is configured of the carriage 3 on which the recording head 1 can be mounted and a carriage driving portion that moves the carriage 3 along a main scanning direction, and the movement of the carriage 3 causes the recording head 1 to move in the main scanning direction. The carriage driving portion is configured of the driving motor 6, the timing belt 7 and the like.

The recording head 1 has the multiple nozzle openings 21 along the sub scanning direction and discharges liquid droplets through each nozzle opening 21 at the timing specified by the dot-pattern data or the like. Then, electric signals, such as a driving signal (COM) and recording data (SI), which will be described later, are supplied to the piezoelectric element 300 of the recording head 1 through external wiring (not shown). In the printer controller 511 and the print engine 512 configured as described above, the printer controller 511 and the driving circuit (not shown) serve as the driving unit (driving system) that applies predetermined driving signals to the piezoelectric element 300; the driving circuit has a latch 532, a level shifter 533, a switch 534 and the like, and selectively inputs the driving signals, which are outputted from the driving signal generation circuit 519 and have the predetermined waveforms, to the piezoelectric element 300.

A shift register 531 (hereinafter, referred to as a "SR 531"), the latch 532, the level shifter 533, the switch 534 and the piezoelectric element 300 are provided for each of the nozzle openings 21 of the recording head 1, in which the SR 531, the latch 532, the level shifter 533 and the switch 534 generate a driving pulse from a discharge driving signal, a relaxation driving signal or the like generated by the driving signal generation circuit 519. Here, the driving pulse is an application pulse that is actually applied to the piezoelectric element 300.

In such a recording head 1, at first, in synchronization with a clock signal (CK) from the oscillation circuit 517, the recording data (SI) configuring the dot-pattern data is serial-transferred from the output buffer 523 to the SR 531 to be set therein in series. In this case, of the printing data of the all nozzle openings 21, the most significant bit data is serial-transferred first, and the second most significant bit data is serial-transferred after the transfer of the most significant bit data has been completed. The remaining bit data is serial-transferred in series in the order of bit significance in the same manner as described above.

When the bit data of the recording data for all the nozzle openings are set in each SR 531, the controller 516 outputs a latch signal (LAT) to the latch 532 at a predetermined timing. Upon receiving the latch signal, the latch 532 latches the printing data set in the SR 531. Recording data (LATout) latched by the latch 532 is applied to the level shifter 533 as a voltage amplifier. In the case in which the recording data is "1", for example, the level shifter 533 boosts this recording data to a voltage value capable of driving the switch 534, for example, to tens of volts. The boosted recording data is applied to each of the switches 534, and each of the switches 534 is put into a connected state by the recording data.

Meanwhile, the driving signal (COM) generated by the driving signal generation circuit 519 is also applied to each of the switches 534 and when the switch 534 is selectively put into a connected state, the driving signal is selectively applied to the piezoelectric element 300 connected with this switch 534. In the recording head 1 exemplified above, it is possible to control whether or not to apply the discharge driving signal to the piezoelectric element 300 in accordance with the recording data. For example, during a period of time when the recording data is "1", since the switch 534 is made to be in a connected state by the latch signal (LAT), a driving signal (COMout) can be supplied to the piezoelectric element 300, and the piezoelectric element 300 is displaced (deformed) by the supplied driving signal (COMout). Further, during a period of time when the recording data is "0", since the switch 534 is put into a disconnected state, the supply of the driving signal to the piezoelectric element 300 is blocked. Because each piezoelectric element 300 holds an immediately previous potential during the period of time when the recording data is "0", the immediately previous displacement state is maintained.

The above-described piezoelectric element 300 is a piezoelectric element 300 in a flexural vibration mode. In the case in which the piezoelectric element 300 in a flexural vibration mode is used, when voltage is applied to the piezoelectric layer 70, the piezoelectric layer 70 contracts in a perpendicular direction with respect to the voltage (a direction toward the piezoelectric element holding portion 31) and causes the piezoelectric element 300 and the vibration plate 50 to bend toward the pressure generation chamber 12, thereby shrinking the pressure generation chamber 12. In the other hand, when the voltage is lowered, the piezoelectric layer 70 extends in a direction towards the piezoelectric element holding portion and causes the piezoelectric element 300 and the vibration plate 50 to bend in a direction opposite to the pressure generation chamber 12, thereby expanding the pressure generation chamber 12. In such a recording head 1, charging/discharging the piezoelectric element 300 causes the volume of the corresponding pressure generation chamber 12 to change and thus a droplet can be discharged through the nozzle opening 21 by making use of the pressure fluctuation of the pressure generation chamber 12.

Next, a driving waveform representing the driving signal (COM) which is inputted to the piezoelectric element of the ink jet recording head to be mounted on the ink jet recording apparatus will be described using FIGS. 13 and 14.

Figure 13:
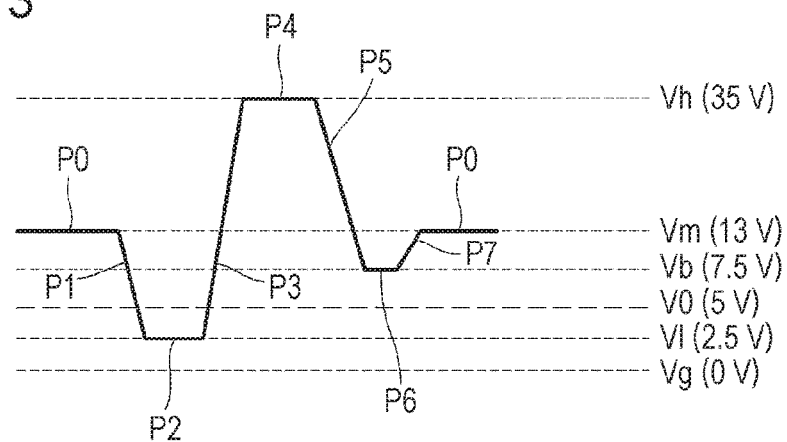
FIG. 13 is a diagram showing an example of a driving signal (driving waveform) of the ink jet recording apparatus.

FIG. 13 shows an example of a driving waveform that represents the driving signal of the ink jet recording apparatus. As shown in FIG. 13, the driving waveform changes between a minimum voltage Vl and a maximum voltage Vh. A reference voltage V0 is applied to the common electrode (in the case of the embodiment, the second electrode 80). For example, in the case in which the reference voltage V0 is set to 5 V, the voltage of the common electrode is held at a reference potential of 5 V. Four kinds of voltages of an intermediate voltage Vm, a minimum voltage Vl, a maximum voltage Vh, and a buffer voltage Vb, which is lower than the intermediate voltage Vm and higher than the reference voltage V0 are applied to the individual electrode (in the case of the embodiment, the first electrode 60). In FIG. 13, examples of each voltage value are shown. The minimum voltage Vl is 2.5 V, the reference voltage V0 is 5 V, the buffer voltage Vb is 7.5 V, the intermediate voltage Vm is 13 V, and the maximum voltage Vh is 35 V. All of these values are based on a potential 0 V of GND (Vg). It is possible to drive the piezoelectric element 300 with the driving waveform as shown in FIG. 13 by changing the voltage to be applied to the individual electrode while holding the voltage of the common electrode at the reference potential.

The driving waveform in FIG. 13 includes the following processes P0 to P7. A process P0 is a state in which the piezoelectric element 300 stands by for driving (standby state). At this time, the intermediate voltage Vm is applied to the individual electrode. A first voltage change process P1 is a process of expanding the pressure generation chamber 12. At this time, the voltage to be applied to the individual electrode changes from the intermediate voltage Vm to the minimum voltage Vl. A first hold process P2 is a process of temporarily holding the state after the voltage is changed by the first voltage change process P1. At this time, the voltage to be applied to the individual electrode is temporarily held at the minimum voltage Vl as it is. A second voltage change process P3 is a process of shrinking the pressure generation chamber 12. At this time, the voltage to be applied to the individual electrode changes from the minimum voltage Vl to the maximum voltage Vh. A second hold process P4 is a process of temporarily holding the state after the voltage is changed by the second voltage change process P3. At this time, the voltage to be applied to the individual electrode is temporarily held at the maximum voltage Vh as it is. A third voltage change process P5 is a process of expanding the pressure generation chamber 12. At this time, the voltage to be applied to the individual electrode changes from the maximum voltage Vh to the buffer voltage Vb. A third hold process P6 is a process of temporarily holding the state after the voltage is changed by the third voltage change process P5. At this time, the voltage to be applied to the individual electrode is temporarily held at the buffer voltage Vb. A fourth voltage change process P7 is a process of returning the state of the piezoelectric element 300 to the standby state. At this time, the voltage to be applied to the individual electrode changes from the buffer voltage Vb to the intermediate voltage Vm.

In the driving waveform shown in FIG. 13, the maximum voltage Vh is 35 V. Each of the voltages Vl, V0, Vb, Vm, and Vh to be applied to the first electrode 60 and the second electrode 80 is equal to or lower than the maximum voltage of 35 V. The driving of the piezoelectric element 300 at the maximum voltage or lower means that the piezoelectric element 300 drives with the driving waveform that changes at the maximum voltage Vh or lower, in other words, the voltage equal to or lower than the maximum voltage Vh is applied to the first electrode 60 and the second electrode 80 to drive the piezoelectric element 300. The value of the voltage is based on a potential 0 V of GND.

Figure 14:
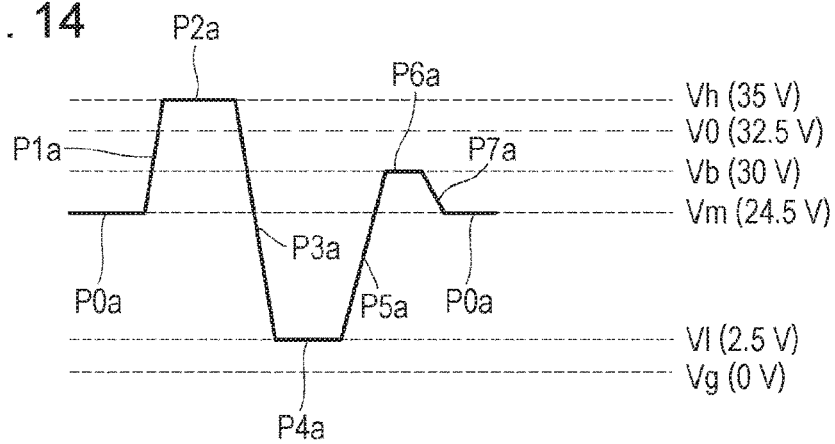
FIG. 14 is a diagram showing an example of a driving signal (driving waveform) of the ink jet recording apparatus.

On the other hand, FIG. 14 shows an example of a driving waveform representing a driving signal of the ink jet recording apparatus. The driving waveform shown in FIG. 14 is a driving waveform obtained by reversing the driving waveform shown in FIG. 13 about a reference voltage V0. The driving waveform in FIG. 14 changes between a minimum voltage Vl and a maximum voltage Vh. The reference voltage V0 is applied to the common electrode (in the case of the embodiment, the second electrode 80). For example, in the case in which the reference voltage V0 is set to 32.5 V, the common electrode is held at a reference potential of 32.5 V. Four kinds of voltages of an intermediate voltage Vm, a minimum voltage Vl, a maximum voltage Vh, and a buffer voltage Vb, which is higher than the intermediate voltage Vm and lower than the reference voltage V0 are applied to the individual electrode (in the case of the embodiment, the first electrode 60). In FIG. 14, examples of each voltage value are shown. The minimum voltage Vl is 2.5 V, the reference voltage V0 is 32.5 V, the buffer voltage Vb is 30 V, the intermediate voltage Vm is 24.5 V, and the maximum voltage Vh is 35 V. All of these values are based on a potential 0 V of GND (Vg). It is possible to drive the piezoelectric element 300 with the driving waveform as shown in FIG. 14 by changing the voltage to be applied to the individual electrode while holding the voltage of the common electrode at the reference potential.

The driving waveform in FIG. 14 includes the following processes P0a to P7a. A process P0a is a state in which the piezoelectric element 300 stands by for driving (standby state). At this time, the intermediate voltage Vm is applied to the individual electrode. A first voltage change process P1a is a process of shrinking the pressure generation chamber 12. At this time, the voltage to be applied to the individual electrode changes from the intermediate voltage Vm to the maximum voltage Vh. A first hold process P2a is a process of temporarily holding the state after the voltage is changed by the first voltage change process P1a. At this time, the voltage to be applied to the individual electrode is temporarily held at the maximum voltage Vh as it is. A second voltage change process P3a is a process of expanding the pressure generation chamber 12. At this time, the voltage to be applied to the individual electrode changes from the maximum voltage Vh to the minimum voltage Vl. A second hold process P4a is a process of temporarily holding the state after the voltage is changed by the second voltage change process P3a. At this time, the voltage to be applied to the individual electrode is temporarily held at the minimum voltage Vl as it is. A third voltage change process P5a is a process of shrinking the pressure generation chamber 12. At this time, the voltage to be applied to the individual electrode changes from the minimum voltage Vl to the buffer voltage Vb. A third hold process P6a is a process of temporarily holding the state after the voltage is changed by the third voltage change process P5a. At this time, the voltage to be applied to the individual electrode is temporarily held at the buffer voltage Vb as it is. A fourth voltage change process P7a is a process of returning the state of the piezoelectric element 300 to the standby state. At this time, the voltage to be applied to the individual electrode changes from the buffer voltage Vb to the intermediate voltage Vm.

In the driving waveform shown in FIG. 14, the maximum voltage Vh is 35 V. The maximum voltage of each of the voltages Vl, V0, Vb, Vm, and Vh to be applied to the first electrode 60 and the second electrode 80 is 35 V or lower. That is, the piezoelectric element 300 is driven at the maximum voltage or lower even with the driving waveform shown in FIG. 14.

In the embodiment, in the case in which the insulating film 52 made of zirconium oxide ($ZrO_2$) is formed, as described above, the piezoelectric element 300 in which the FN current starting voltage is, for example, 35 V, or the PF current starting voltage is, for example, 45 V is prepared by specifying the substrate temperature and the pressure, of the condition for the formation of the zirconium film. In the case in which the recording head 1 on which such a piezoelectric element 300 is mounted is driven at the maximum voltage that is lower than the FN current starting voltage or the PF current starting voltage, the FN current or the PF current can be prevented from being generated. As a result, it is possible to drive the piezoelectric element 300 without breaking the piezoelectric layer 70. That is, it is possible to expend the service life of the recording head 1 by preventing degradation of voltage withstanding characteristics due to deterioration over time to achieve a long service life.

In the case of preparing such a piezoelectric device (recording head 1) having a long service life, after the piezoelectric element 300 is manufactured, the FN current starting voltage or the PF current starting voltage is measured. The driving system is set such that based on either of the measured voltage, preferably both of the measured voltages, the driving waveform of the maximum voltage lower than the measured value thereof is selected to drive the piezoelectric element 300 with the selected waveform.

Here, the FN current refers to a current that is generated due to an electrode interface in the case in which electrons are emitted from the electrode to a conductor due to tunneling of potential hindrance (quantum mechanical tunnel emission). The FN current is obtained by plotting from data of the voltage-current properties (I-V characteristics) of the piezoelectric element 300 based on the following equation (5). In addition, the PF current is a current that is mainly generated due to crystal defects of the piezoelectric layer 70 in the case in which electrons are emitted to a conductor from an impurity level over the potential barrier (Poole-Frenkel effect). The PF current is obtained by plotting from data of the voltage-current properties (I-V characteristics) of the piezoelectric element 300 based on the following equation (6).

$$J \sim \varepsilon^2 \exp\left[-\frac{4\sqrt{2m^\phi}\,(q\phi_B)^{\frac{3}{2}}}{3q\hbar\varepsilon}\right] \tag{5}$$

-continued $$J \sim \varepsilon \exp\left[\frac{-q\left(\phi_B - \sqrt{q\varepsilon/\pi\varepsilon_i}\right)}{kT}\right] \quad (6)$$

(In the equation, $J$ represents current density, $\varepsilon$ represents an electric filed, $m^\phi$ represents an effective mass, $q$ represents an electric charge, $\Phi_B$ represents a barrier height, $h$ represents a converted Planck constant, $\varepsilon_i$ represents a dielectric constant of the insulating film 52, $k$ represents a Boltzmann constant, and $T$ represents temperature.)

That is, in other words, when the recording head 1 on which the piezoelectric element 300 is mounted at the maximum voltage which is lower than the FN current starting voltage or the PF current starting voltage can be driven without specifying the conditions for zirconium film formation as described above, the piezoelectric layer 70 can be prevented from being broken.

In the embodiment, a driving waveform representing the driving signal (COM) to be inputted to the piezoelectric element 300 in the following procedure is generated. First, a FN current starting voltage or a PF current starting voltage is calculated from a result obtained by plotting from the data of the voltage-current properties (I-V characteristics) of the piezoelectric element 300 based on the equation (5) or (6) in advance (calculation process). Next, a voltage which is lower than these starting voltages is appropriately determined based on the FN current starting voltage or the PF current starting voltage obtained from the calculation process, and the driving waveform to be inputted to the piezoelectric element 300 is generated or selected (generation process or selection process). Then, as described above, the driving signal having the driving waveform generated in the generation process or the selection process is outputted from the driving signal generation circuit 519 and the above driving signal is inputted to the piezoelectric element 300 from the driving circuit (not shown) having the latch 532, the level shifter 533, the switch 534, and the like.

In the embodiment, the controller 516 may functions as a calculation unit that calculates a FN current starting voltage or a PF current starting voltage and a generation unit that generates a driving waveform to be inputted to the piezoelectric element 300. Alternatively, a separate controller may be allowed to control the driving signal generation circuit 519. In addition, the calculation process and the generation process or selection process may be carried out before the assembly process of the apparatus (recording apparatus I).

Accordingly, in the recording head 1, in the case of using the piezoelectric element 300 in which the conditions for zirconium film formation are specified as described above and a high voltage in which the FN current starting voltage is 38 V or the PF current starting voltage is 45 V is applied, when the maximum voltage Vh of, for example, about 30 V to 40 V is applied, the piezoelectric element 300 can be driven without breaking the piezoelectric layer 70. Thus, it is possible to extend the service life of the recording head 1 by preventing degradation of voltage withstanding characteristics due to deterioration over time so as to achieve a long service life.

That is, in the case in which the maximum voltage Vh which is higher than 38 V and lower than 45 V is applied, since the PF current does not flow, it is considered that the piezoelectric element 300 can be driven without breaking the piezoelectric layer 70 and the service life of the piezoelectric element 300 can be extended. In addition, in the case in which the maximum voltage Vh which is lower than V is applied, since both the FN current and the PF current do not flow, the service life of the piezoelectric element 300 can be further extended. In the case in which the piezoelectric element 300 in which the FN current starting voltage is much lower than 38 V is used, the driving waveform of the maximum voltage Vh which is lower the voltage may be used.

Examples

Hereinafter, the invention will be described in more detail with reference to examples. The invention is not limited to the following examples.

Preparation of Substrate

Figure 15:
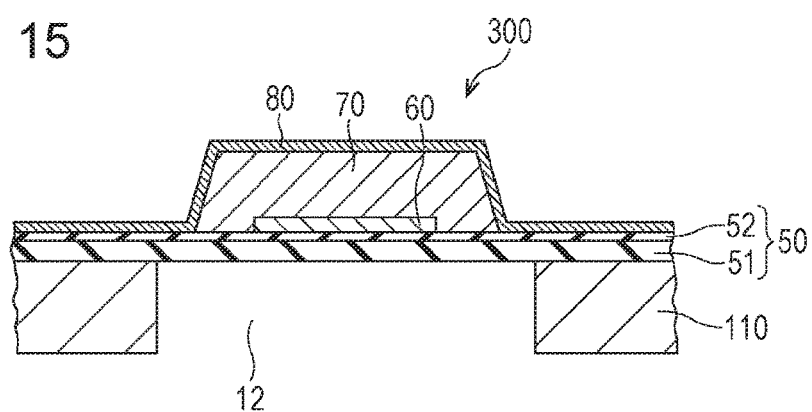
FIG. 15 is a cross-sectional view showing a schematic configuration for piezoelectric elements of Examples and Comparative Examples.

FIG. 15 is a view showing a schematic configuration for piezoelectric elements which were prepared as Samples 1 to 3 respectively. As shown in the drawing, in Sample 1, the elastic film 51 made of silicon oxide ($SiO_2$) was formed on the surface of the silicon substrate 110 by oxidizing the silicon substrate 110. Next, a film of zirconium (Zr) was sputtered under the condition or film formation of a substrate heating temperature of 322° C. and a pressure of 0.8 Pa, the film was subjected to an oxidizing treatment (annealing) in an oxidizing furnace at 750° C., and the insulating film 52 made of zirconium oxide ($ZrO_2$) was formed on the elastic film 51. Thus, the vibration plate 50 formed of the elastic film 51 and the insulating film 52 was prepared. Thereafter, films of titanium (Ti), platinum (Pt), and iridium (Ir) were sequentially formed on the insulating film 52 by a sputtering method and the films were patterned into a predetermined shape to form the first electrode 60 so as to obtain a substrate with electrodes.

Preparation of Piezoelectric Element

In Sample 1, in order to form the piezoelectric layer 70 made of lead zirconate titanate (PZT), a solution for a piezoelectric layer including a predetermined metal complex was separately prepared. An appropriate amount of the solution for a piezoelectric layer was collected with a micropipette and added dropwise to the substrate with electrodes set in a spin coater. The solution was applied with the spin coater to form a film. Then, the film was baked on a hot plate to form an amorphous film. Then, the film was baked using a lamp annealing furnace to form a first piezoelectric film 74 (not shown). In the same manner, processes from coating to baking were repeatedly carried out and the piezoelectric layer 70 formed of plural piezoelectric films 74 was formed and patterned into a predetermined shape. Thereafter, an Ir film was formed on the piezoelectric layer 70 by the sputtering method and patterned into a predetermined shape to form the second electrode 80. Thus, the piezoelectric element 300 was obtained.

Next, the mask film 53 (not shown) was newly formed on the silicon substrate 110 and patterned into a predetermined shape. The silicon substrate 110 was subjected to anisotropic etching (wet etching) using an alkali solution (KOH) through the mask film 53 after the patterning and the pressure generation chamber 12 corresponding to the piezoelectric element 300 was formed. Thus, Sample 1 was obtained.

In Sample 2, the piezoelectric element 300 was prepared in the same manner as in the preparation of Sample except that the conditions for zirconium film formation were changed such that the substrate heating temperature was changed to room temperature and the pressure was changed to 0.5 Pa, the condition for annealing was set to 850° C., and the insulating film 52 made of $ZrO_2$ was formed.

In Sample 3, the piezoelectric element 300 was prepared in the same manner as in the preparation of Sample 1 except that the conditions for zirconium film formation were changed such that the substrate heating temperature was changed to room temperature and the pressure was changed to 0.023 Pa, the condition for annealing was set to 850° C., and the insulating film 52 made of $ZrO_2$ was formed.

In Samples 1 to 3, the conditions for film formation of the insulating film 52 made of $ZrO_2$ are as shown in Table below. In addition, the results of voltage withstanding characteristic evaluation and electric characteristic evaluation, which will be described later, are also shown in Table.

TABLE

| Lot | Conditions for $ZrO_2$ film formation (film formation temperature/pressure/ annealing temperature) | Result of D resistance at 35 V | 20% breakage time (min) in D resistance at 53 V | FN current starting voltage | PF current starting voltage |
|---|---|---|---|---|---|
| Sample 1 | 322° C./0.8 Pa/750° C. | No breakage in 270 hr | 2900 | 38 V | 45 V |
| Sample 2 | RT/0.5 Pa/850° C. | 80% or more breakage in 100 hr* | 130 | 28 V | 30 V |
| Sample 3 | RT/0.023 Pa/850° C. | 80% or more breakage in 100 hr* | 50 | 22 V | 19 V |

*No significant difference in Samples 2 and 3

Voltage Withstanding Characteristic Evaluation for Piezoelectric Element

In Samples 1 to 3, a DC energization test (D resistance test) was carried out at an application voltage of 35 V and an application voltage of 53 V. In the DC energization test at an application voltage of 35 V, as shown in Table, 80% or more of the piezoelectric element 300 was broken in 100 hours in Samples 2 and 3. In contrast, in Sample 1, when the energization is continued for 270 hours, the piezoelectric element 300 was not broken.

Figure 16:
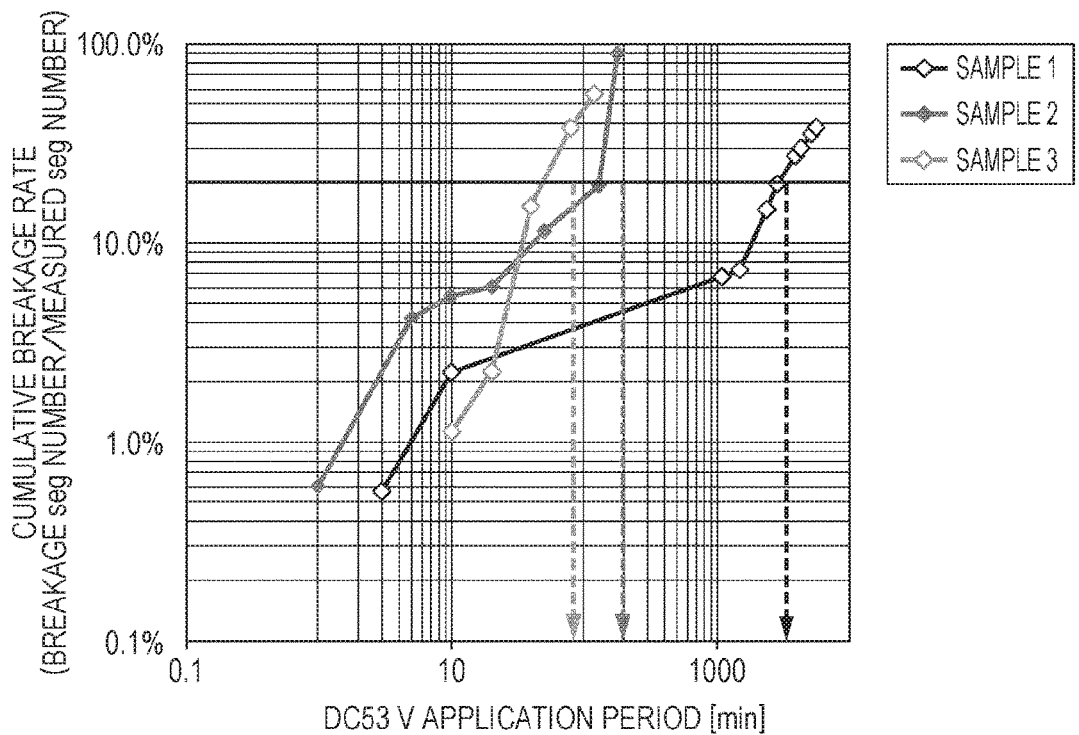
FIG. 16 is a graph showing results of a DC energization test of piezoelectric elements of Examples and Comparative Examples.

On the other hand, in the DC energization test at an application voltage of 53 V, a cumulative breakage rate for the application time to each piezoelectric element 300 in FIG. 16 is shown and the time when 20% is broken was shown in Table. As shown in Table, in Samples 2 and 3, the piezoelectric element 300 was broken in a short period of time (130 minutes, 50 minutes). In contrast, in Sample 1, the piezoelectric element 300 was broken after the energization was continued for 2,900 minutes (48 hours or longer).

Electric Characteristic Evaluation of Piezoelectric Element

Figure 17:
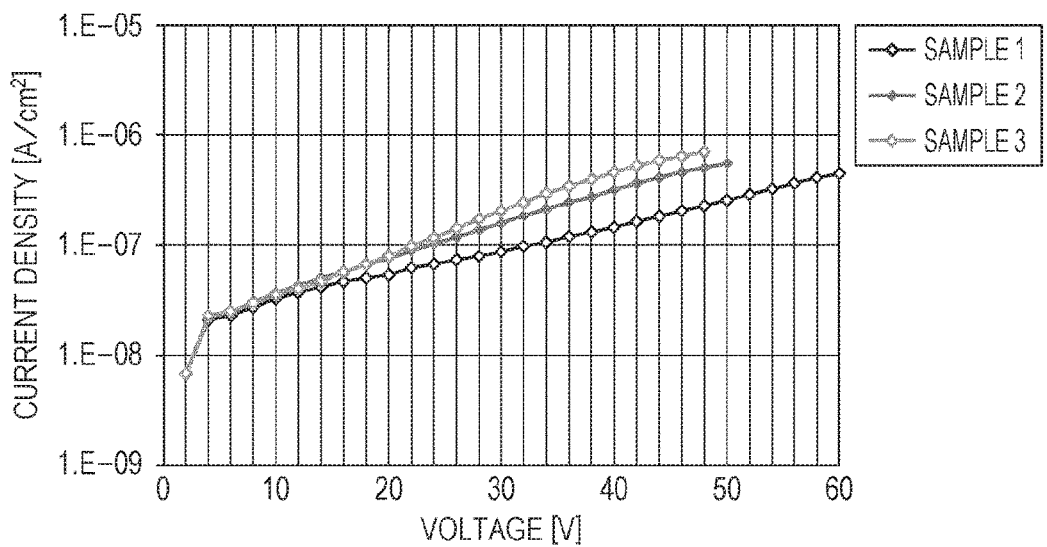
FIG. 17 is a graph showing results obtained by measuring the I-V characteristics of the piezoelectric elements of Examples and Comparative Examples.

In Samples 1 to 3, the voltage-current characteristic (I-V characteristics) evaluation was carried out (50° C., delay time: 60 seconds), and the result was shown in FIG. 17. In addition, the results of plotting from the data obtained from FIG. 17, based on the following equation (7) of a tunnel current mechanism (FN: Fowler-Nordheim) and the following equation (8) of a Poole-Frenkel current mechanism (PF) were shown in FIGS. 18 and 19. Further, a FN current starting voltage and a PF current starting voltage calculated from the data obtained from FIGS. 18 and 19 were shown in FIG. 20 and summarized in Table.

$$J \sim \varepsilon^2 \exp\left[-\frac{4\sqrt{2m^\phi}\,(q\phi_B)^{\frac{3}{2}}}{3q\hbar\varepsilon}\right] \quad (7)$$

$$J \sim \varepsilon \exp\left[\frac{-q\left(\phi_B - \sqrt{q\varepsilon/\pi\varepsilon_i}\right)}{kT}\right] \quad (8)$$

(In the equation, $J$ represents current density, $\varepsilon$ represents an electric filed, $m^\phi$ represents an effective mass, $q$ represents an electric charge, $\Phi_B$ represents a barrier height, $\hbar$ represents a converted Planck constant, $\varepsilon_i$ represents a dielectric constant of the insulating film 52, $k$ represents a Boltzmann constant, and $T$ represents temperature.)

Figure 18:
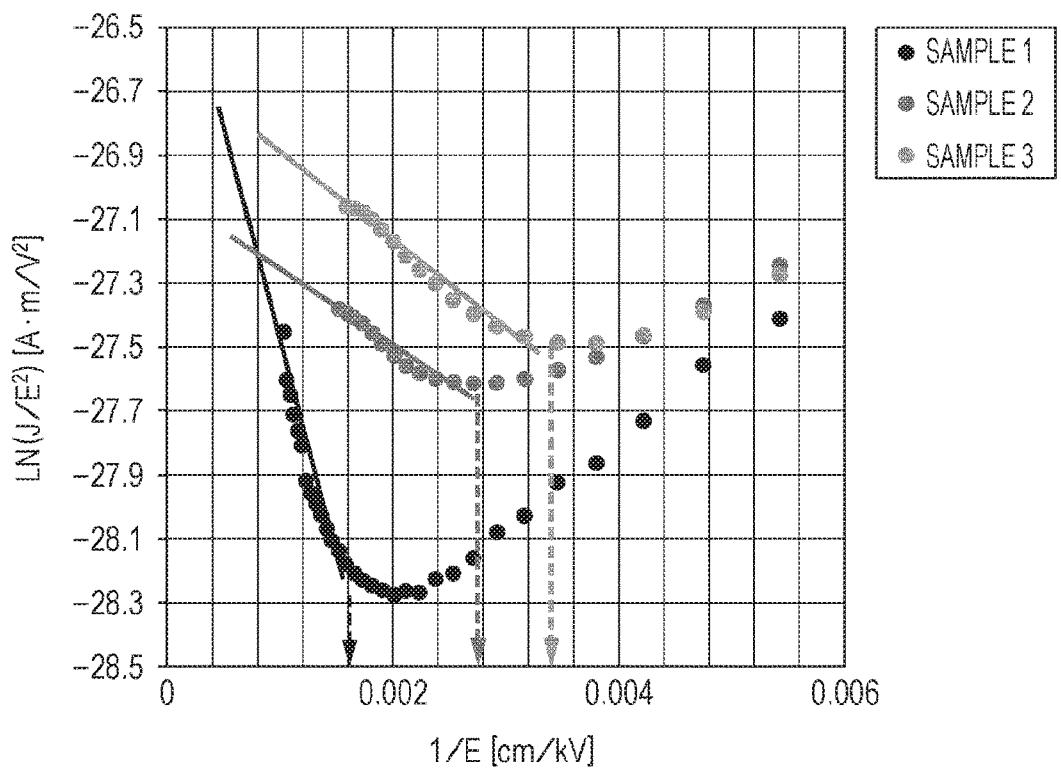
FIG. 18 is a graph showing results of a FN plot based on data of I-V characteristics.
Figure 19:
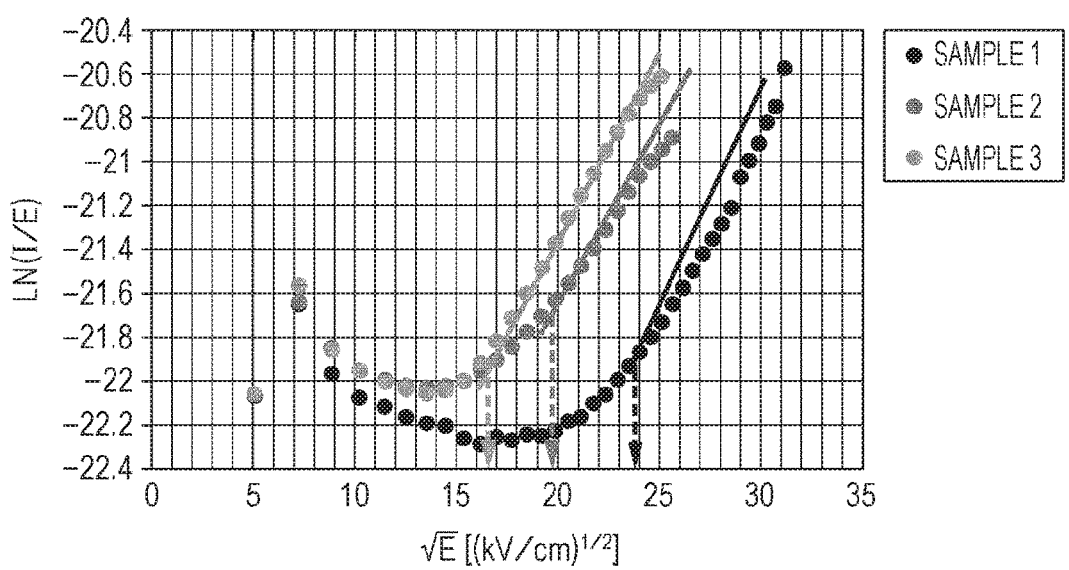
FIG. 19 is a graph showing results of a PF plot based on date of I-V characteristics.
Figure 20:
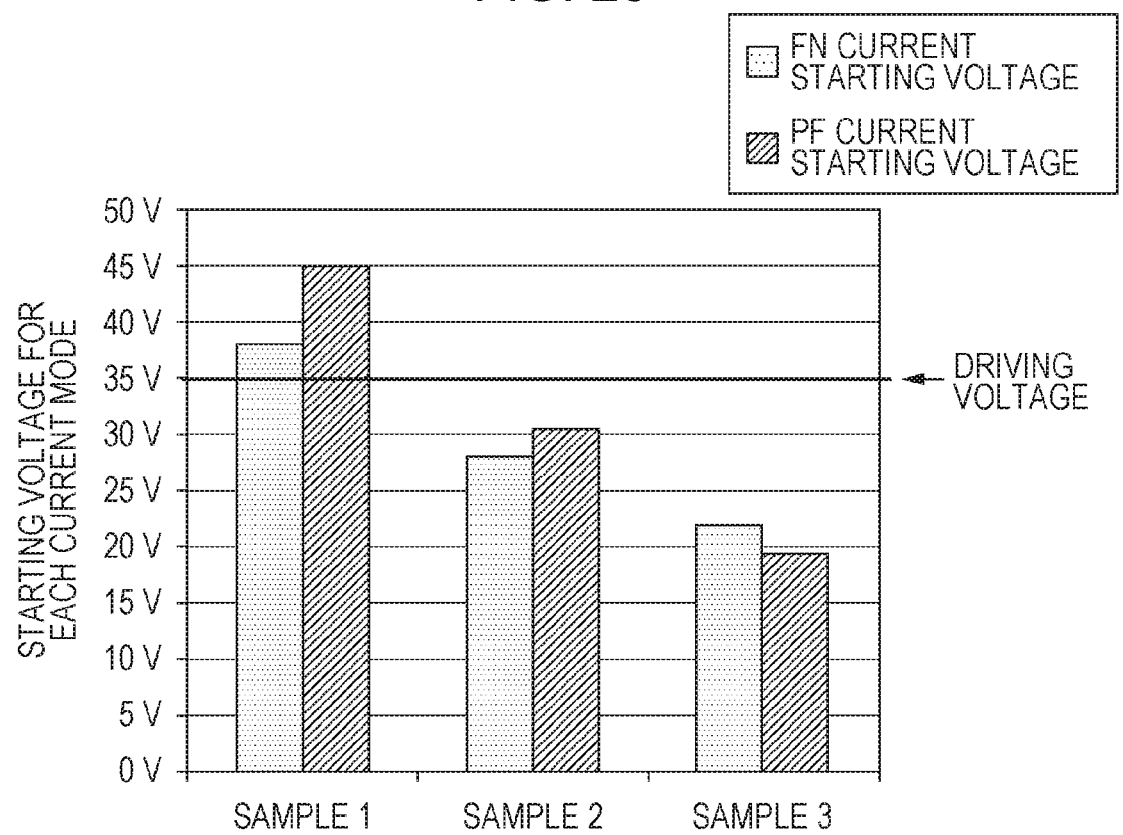
FIG. 20 is a graph showing starting voltages in a FN current mode and a PF current mode.

As shown in FIGS. 18 and 19, it was found that in Samples 1 to 3, a liner region was observed on a high electric filed side and the FN current and the PF current flowed. In addition, as shown in Table, it was found that in Samples 2 and 3, while the FN current starting voltage and the PF current starting voltage were low, in Sample 1, the FN current starting voltage and the PF current starting voltage were high. That is, as shown in FIG. 20, since Sample 1 is driven at a driving voltage of 35 V (maximum voltage Vh) which is lower than the FN current starting voltage and the PF current starting voltage, Sample 1 (piezoelectric element 300) can be prevented from being deteriorated and can be used for a long period of time. That is, a device using Sample 1 has a long service life in the case in which the maximum voltage Vh is set to 35 V.

From the above results, when the conditions for film formation of the insulating film 52 made of $ZrO_2$ are set as in the film formation of Sample 1, the voltage withstanding characteristics of the piezoelectric element 300 to be obtained can be improved and the service life of the piezoelectric element 300 can b also extended.

On the other hand, since Samples 2 and 3 were driven with a driving waveform in which a voltage of 35 V which is higher than the FN current starting voltage and the PF current starting voltage is set to the maximum voltage Vh, Samples were apparently deteriorated. However, it is considered that as long as devices using Samples 2 and 3 are driven with a driving waveform in which the maximum voltage Vh is a voltage which is lower than the FN current starting voltage or the PF current starting voltage, for example, about 20 V to 25 V, deterioration can be prevented and the devices can be used for a long period of time.

However, in the driving waveforms shown in FIGS. 13 and 14, when the potential to be applied in the second hold processes P4 and P4a is changed to be small so as to decrease the maximum potential difference, the displacement efficiency may be decreased. Thus, in the case of the devices using Samples 2 and 3, when the voltage to be applied to the common electrode is set to, for example, about 5 V to 10 V, this voltage is used as a reference potential (0 V), and the driving waveforms are made as shown in FIGS.

13 and 14, the maximum potential difference is about 15 V to 20 V and the service life can be prolonged without decreasing the displacement efficiency.

Further, as shown in FIGS. 18 and 19, the electric characteristic of Sample 1 are improved in comparison to Samples 2 and 3 and thus it is considered that PZT in the piezoelectric layer 70 is modified due to an increase in the mechanical strength of the insulating film 52 made of $ZrO_2$. As one reason therefor, it is considered that when there are many crystal effects of PZT, the piezoelectric layer is easily eclectically broken and the service life is short; however, PZT in the piezoelectric layer 70 of Sample 1 is not easily eclectically broken, and thus there are few crystal defects.

As another reason for modifying PZT, it is considered that diffusion of a metal (Ti, Pt, and the like) from the first electrode 60 is reduced by the insulating film 52, barrier performance to hydrogen generated during CAV etching is improved, the crystallinity of $ZrO_2$ in the insulating film 52 is changed, and the like.

Other Embodiments

In the above description, one embodiment of the liquid ejecting head to be mounted on the liquid ejecting apparatus has been described. However, the basic configuration of the invention is not limited to the above embodiment.

In addition to the above first embodiment, an ultrasonic wave measuring apparatus can be configured by providing a control unit that measures a target to be detected using a signal based on at least one of a piezoelectric element obtained by improving the conditions for film formation of the insulating film made of $ZrO_2$ (hereinafter, referred to as the "piezoelectric element of the invention" for the sake of convenience), ultrasonic waves transmitted from the piezoelectric element of the invention, and ultrasonic waves received by the piezoelectric element of the invention.

Such an ultrasonic wave measuring apparatus obtains information on the position, shape, speed, and the like, of an object to be measured, based on a period from the time when transmitting ultrasonic waves to the time when receiving an echo signal that the transmitted ultrasonic waves are reflected by an object to be and returns, and a piezoelectric element can be used as an element for generating ultrasonic waves or an element for detecting the echo signal. When the piezoelectric element of the invention having a long service life by extending the service life thereof is used as such an ultrasonic wave generating element or echo signal detecting element, it is possible to provide an ultrasonic wave measuring apparatus that can be used for a long period of time.

Additionally, in the above first embodiment, the ink jet recording head has been mentioned as one example of the liquid ejecting head. However, the invention is widely applied to all liquid ejecting heads and can be also applied to liquid ejecting heads ejecting liquids other than ink. Examples of the liquid ejecting heads ejecting liquids other than ink include various types of recording heads used in image recording apparatuses such as a printer, color material ejecting heads used for manufacturing color filters of a liquid crystal display and the like, electrode material ejecting heads used for forming electrodes of an EL display, a field emission display (FED) and the like, and bioorganic compound ejecting heads used for manufacturing biochips.

The piezoelectric device according to the invention may include an ultrasonic motor, a temperature-electricity converter, a pressure-electricity converter, a piezoelectric transformer, and filters, such as a cutoff filter for harmful rays such as infrared radiation, an optical filter using the photonic crystal effect of quantum dot formation, or an optical filter using optical interference of a thin film. Further, the piezoelectric device according to the invention may include sensors other than the ultrasonic wave measuring apparatus (ultrasonic wave sensor), for example, an infrared sensor, a thermal sensor, a pressure sensor, and a gyro sensor (angular velocity sensor).

In addition, the piezoelectric element according to the invention can be suitably used as a ferroelectric element. Examples of the ferroelectric element that can be suitably used include a ferroelectric memory, a ferroelectric transistor (FeFET), a ferroelectric arithmetic circuit (FeLogic), and a ferroelectric capacitor. Since the piezoelectric element according to the invention exhibits good pyroelectric properties, the piezoelectric element can be suitably used as a pyroelectric element. Further, the piezoelectric element according to the invention can be also applied to robots using the above-described motors as a driving source.

The entire disclosure of Japanese Patent Application No. 2015-197951, filed Oct. 5, 2015, is expressly incorporated by reference herein.

What is claimed is:

1. A piezoelectric device comprising:
   a plurality of piezoelectric elements arranged adjacent to each other in a first direction and each extending in a second direction, each of the piezoelectric elements including
   a first electrode,
   a second electrode, and
   a piezoelectric layer provided between the first electrode and the second electrode; and
   a driving system that drives the piezoelectric elements by applying voltage to the first electrode and the second electrode,
   wherein the driving system is configured to generate a driving waveform to drive the piezoelectric elements, wherein the driving system is configured to generate the driving waveform based on at least one of a predetermined tunnel current and a predetermined Poole-Frenkel current of the piezoelectric elements such that the driving waveform does not exceed a predetermined maximum voltage that is lower than a voltage at which the at least one of the predetermined tunnel current and the predetermined Poole-Frenkel current starts to be generated in the piezoelectric elements, and
   wherein the second electrode is provided on an outer surface of the piezoelectric layer extending across the plurality of piezoelectric elements in the first direction.

2. The piezoelectric device according to claim 1, wherein the predetermined maximum voltage is a maximum difference with a potential to be applied to the other electrode in a case in which a potential to be applied to one electrode is set as a reference potential.

3. A method of driving a piezoelectric device comprising:
   determining at least one of a tunnel current and a Poole-Frenkel current of a plurality of piezoelectric elements arranged adjacent to each other in a first direction and each extending in a second direction;
   determining a maximum voltage that is lower than a voltage at which the at least one of the tunnel current and the Poole-Frenkel current starts to be generated in the piezoelectric elements;
   generating a driving waveform to apply a voltage to the piezoelectric elements such that the driving waveform does not exceed the maximum voltage, wherein the piezoelectric elements includes a first electrode, a second electrode, and a piezoelectric layer provided between the first electrode and the second electrode to drive the piezoelectric elements,
wherein the second electrode is provided on an outer surface of the piezoelectric layer extending across the plurality of piezoelectric elements in the first direction.

4. The piezoelectric device according to claim 1 further comprising a controller configured to calculate the predetermined maximum voltage in accordance with the at least one of the predetermined tunnel current and the predetermined Poole-Frenkel current and to control the driving system to generate the driving waveform in accordance with the predetermined maximum voltage.

\* \* \* \* \*